(12) United States Patent
Rabkin

(10) Patent No.: US 9,449,980 B2
(45) Date of Patent: Sep. 20, 2016

(54) BAND GAP TAILORING FOR A TUNNELING DIELECTRIC FOR A THREE-DIMENSIONAL MEMORY STRUCTURE

(71) Applicant: SANDISK TECHNOLOGIES INC., Plano, TX (US)

(72) Inventor: Peter Rabkin, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/529,942

(22) Filed: Oct. 31, 2014

(65) Prior Publication Data
US 2016/0126248 A1     May 5, 2016

(51) Int. Cl.
| | |
|---|---|
| H01L 21/336 | (2006.01) |
| H01L 27/115 | (2006.01) |
| H01L 29/40 | (2006.01) |
| H01L 29/66 | (2006.01) |
| H01L 29/788 | (2006.01) |
| H01L 29/792 | (2006.01) |

(52) U.S. Cl.
CPC ..... *H01L 27/11524* (2013.01); *H01L 27/1157* (2013.01); *H01L 27/11519* (2013.01); *H01L 27/11548* (2013.01); *H01L 27/11556* (2013.01); *H01L 27/11565* (2013.01); *H01L 27/11582* (2013.01); *H01L 29/408* (2013.01); *H01L 29/66825* (2013.01); *H01L 29/66833* (2013.01); *H01L 29/7889* (2013.01); *H01L 29/7926* (2013.01)

(58) Field of Classification Search
CPC .................. H01L 27/11524; H01L 27/11529; H01L 27/11556; H01L 27/11573; H01L 27/11582

USPC ........................... 438/257–267; 257/314–321
See application file for complete search history.

(56) References Cited

U.S. PATENT DOCUMENTS

| | | |
|---|---|---|
| 5,915,167 A | 6/1999 | Leedy |
| 6,881,994 B2 | 4/2005 | Lee et al. |
| 7,005,350 B2 | 2/2006 | Walker et al. |
| 7,012,299 B2 | 3/2006 | Mahajani et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Brook Kebede
(74) *Attorney, Agent, or Firm* — The Marbury Law Group PLLC

(57) ABSTRACT

The band gap structure of a tunneling dielectric can be tailored to facilitate programming and erasing of stored information, while enhancing charge storage during states without electrical bias between a semiconductor channel and charge storage elements. The tunneling dielectric includes a layered stack including at least, from outside to inside, a dielectric metal oxide layer and a silicon oxide layer. Upon application of electrical bias for programming or erasing, the band gap structure of the tunneling dielectric provides a lower tunneling barrier than an ONO stack of a comparable effective oxide thickness. Additionally, due to higher capacitive coupling to the channel with high-k metal oxide layer(s) in the tunneling dielectric, the efficiency of program, erase and read operations can be improved. During a zero-bias state, the tunneling dielectric can provide a higher energy barrier than the ONO stack, thereby providing enhanced data retention than the ONO stack.

38 Claims, 18 Drawing Sheets

(56) References Cited

U.S. PATENT DOCUMENTS

| | | |
|---|---|---|
| 2003/0047755 A1 | 3/2003 | Lee et al. |
| 2003/0122204 A1 | 7/2003 | Nomoto et al. |
| 2003/0155582 A1 | 8/2003 | Mahajani et al. |
| 2004/0041192 A1 | 3/2004 | Baker |
| 2004/0125629 A1 | 7/2004 | Scheuerlein et al. |
| 2004/0251488 A1 | 12/2004 | Fujiwara et al. |
| 2005/0062098 A1 | 3/2005 | Mahajani et al. |
| 2006/0281260 A1 | 12/2006 | Lue |
| 2008/0012065 A1 | 1/2008 | Kumar |
| 2012/0261742 A1* | 10/2012 | Hirano .............. H01L 21/28282 257/324 |
| 2014/0061757 A1 | 3/2014 | Kim et al. |
| 2014/0367762 A1* | 12/2014 | Tian .................. H01L 29/66825 257/321 |

OTHER PUBLICATIONS

U.S. Appl. No. 14/133,979, filed Dec. 19, 2013, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

Tung-Shen Chen et al., "Performance Improvement of SONOS Memory by Bandgap Engineering of Charge-Trapping Layer," IEEE Electron Device Letters, vol. 25, No. 4, Apr. 2004, pp. 205-207.

Kuo-Hong Wu et al., "SONOS Device With Tapered Bandgap Nitride Layer," IEEE Transactions on Electron Devices, vol. 52, No. 5, May 2005, pp. 987-992.

Kuo-Hong Wu et al., "PhenomenalSONOS Performance for Next-Generation Flash Memories," Semiconductor Lab, Chung-Cheng Institute of Technology, National Defense University, Taiwan and National Nano-Device Lab Taiwan, pp. 35-40.

A.A. Evtukh et al., "The Multilayer silicon nitride films as a media for charge storagein MNOS structures," IEEE *Xplore* 2.0, Nonvolatile Memory Technology Conference, 1996, Sixth Biennial IEEE International, Jun. 24-26, 1996, Abstract Only.

International Search Report and Written Opinion for PCT/US2015/052718, dated Dec. 21, 2015, 14 pages.

Govoreanu, B. et al., "Variot: a Novel Multilayer Tunnel Barrier Concept for Low-Voltage Nonvolatile Memory Devices," IEEE Electron Device Letters, IEEE Service Center Center, vol. 24, No. 2, pp. 99-101, (2003).

Lin, S. H. et al., "Good 150 [deg.] C Retention and Fast Erase Characteristics in Charge-Trap-Engineered Memory Having a Scaled Si3N4 Layer," Technical Digest, International Electron Devices Meeting, IEDM, XP002751951, 4 pages, (2008).

* cited by examiner

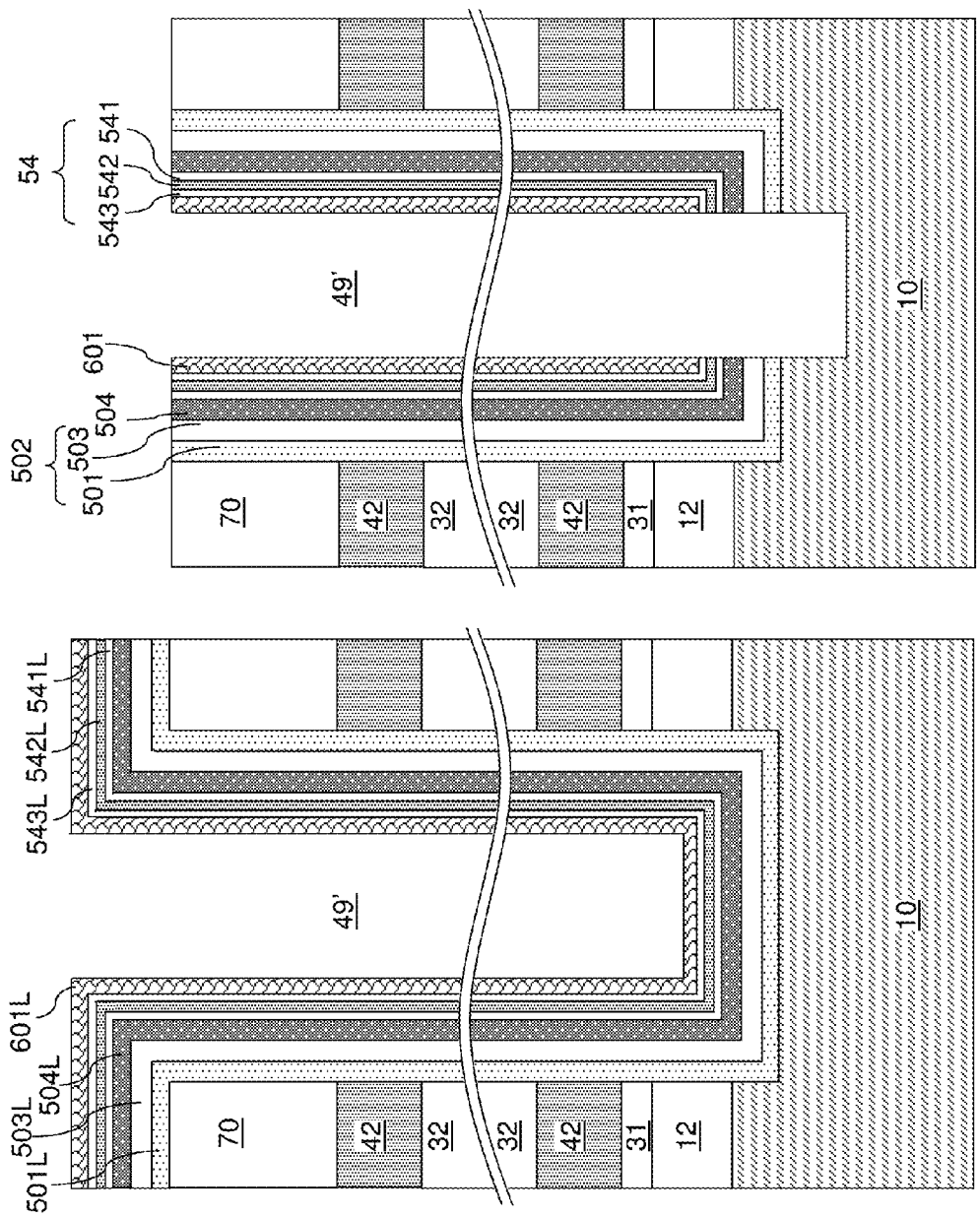

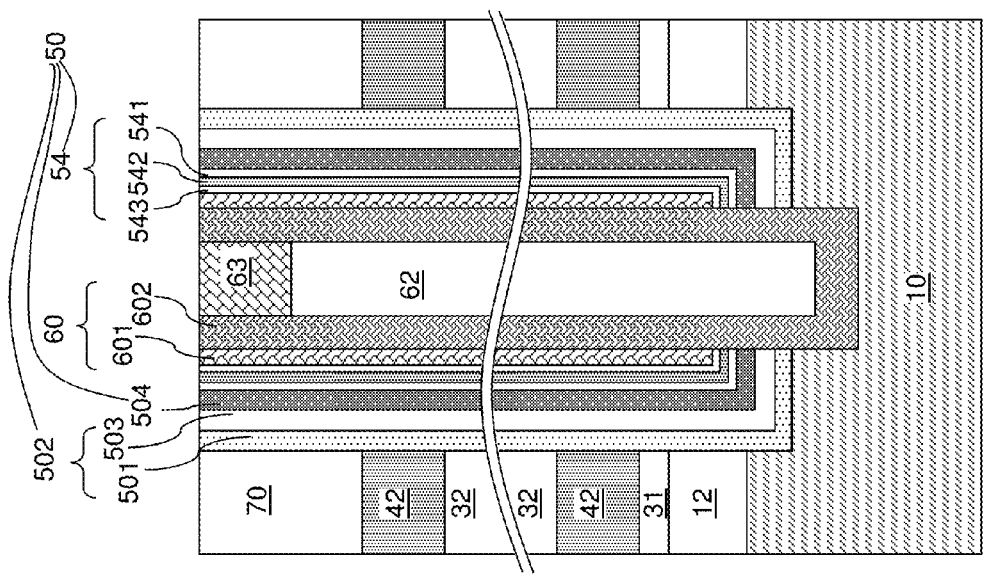
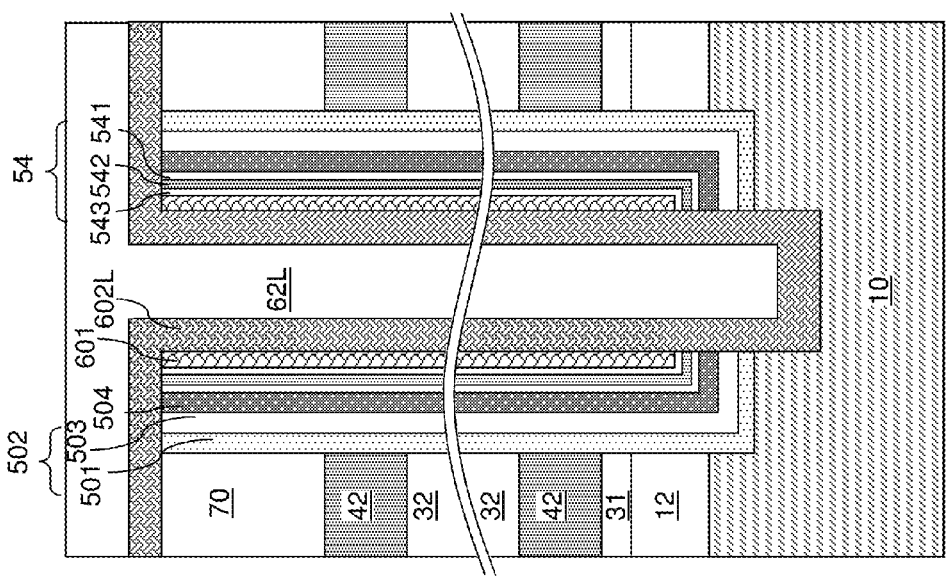

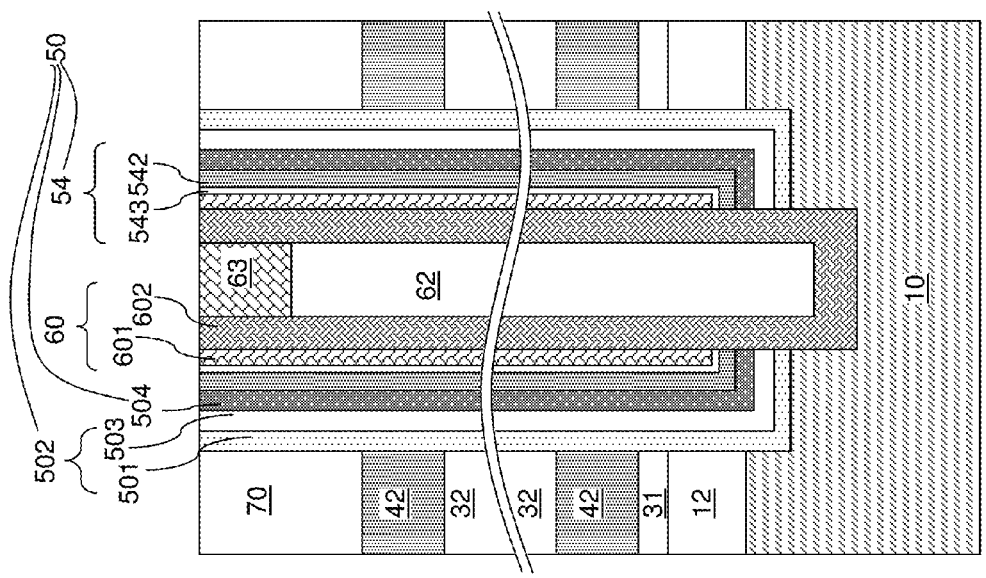
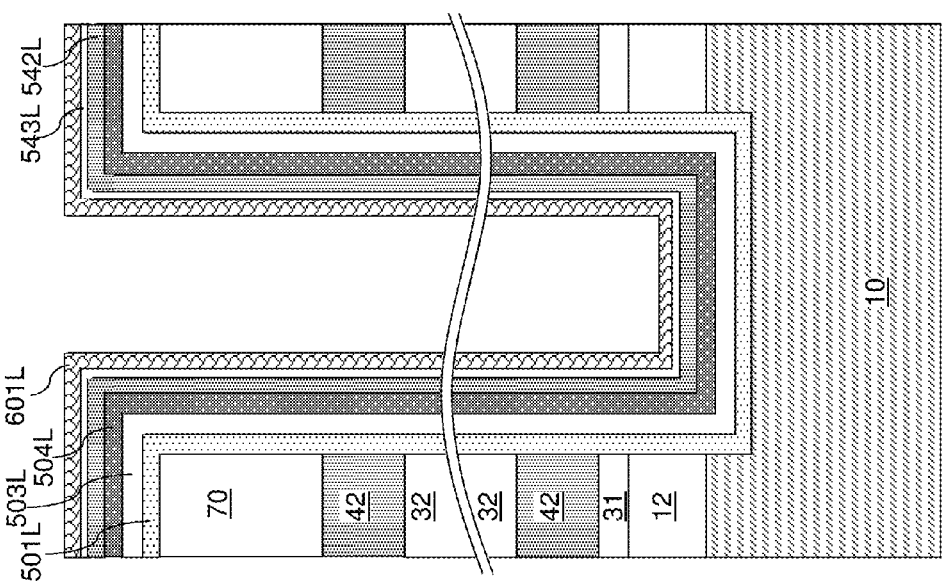

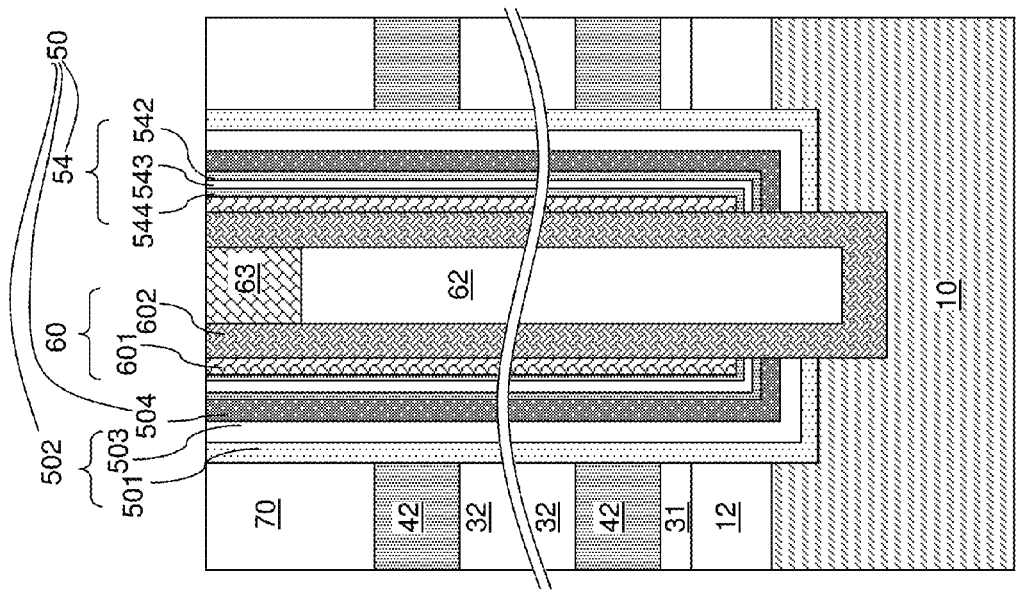
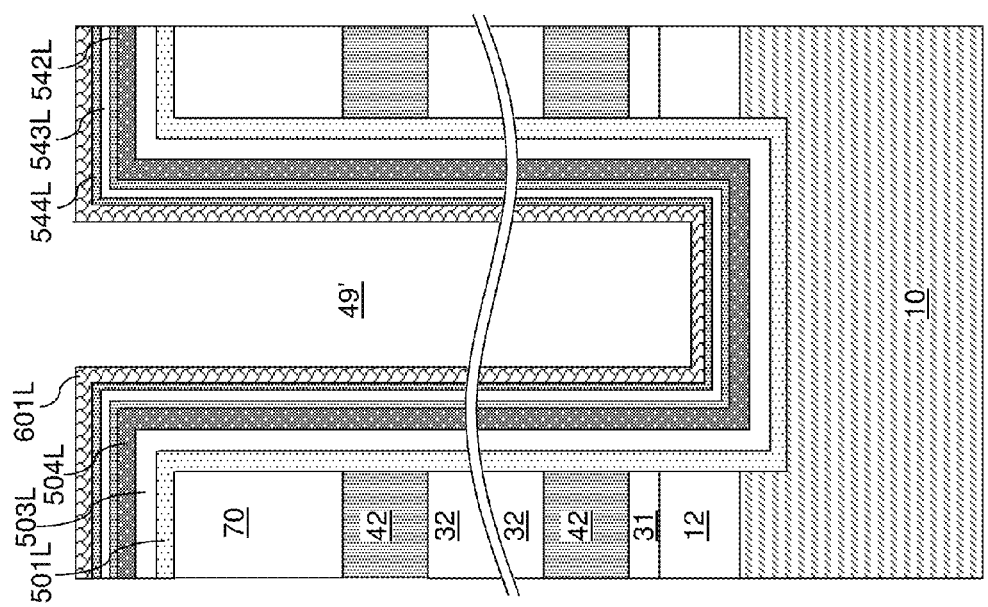
FIG. 4B
FIG. 4A

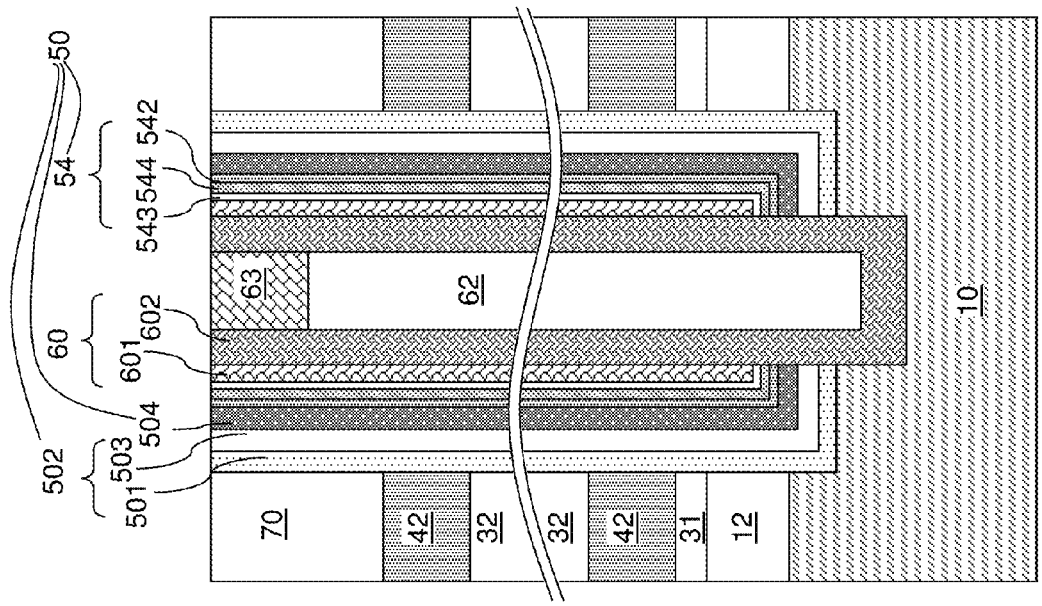
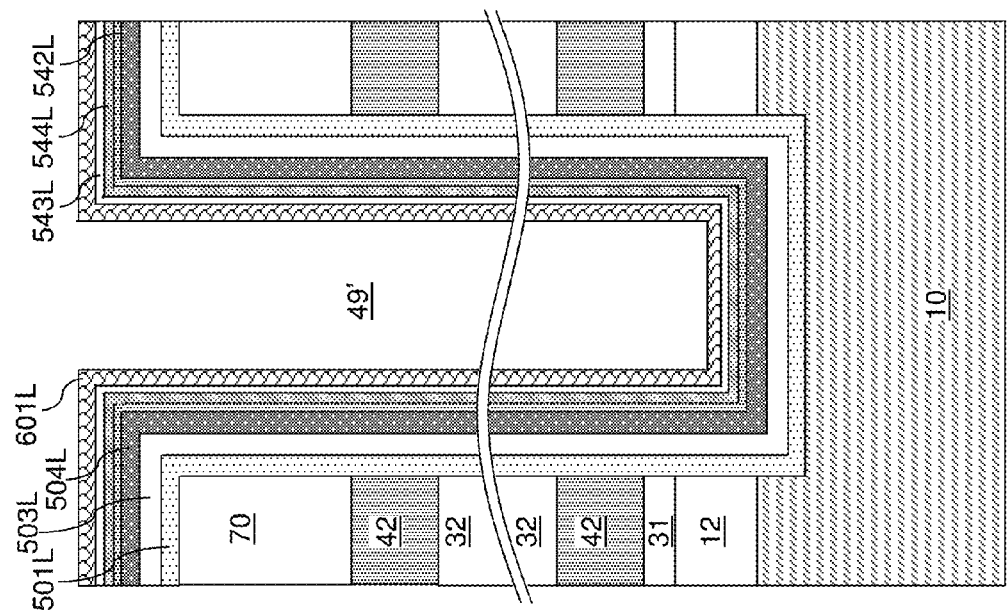

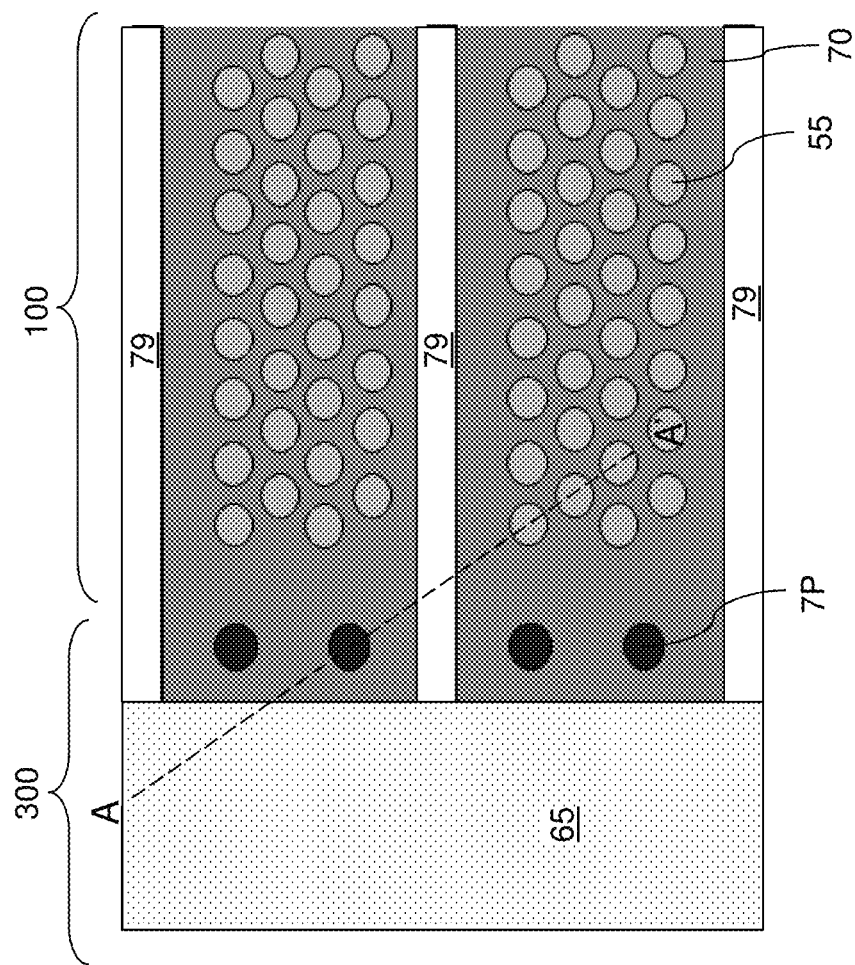

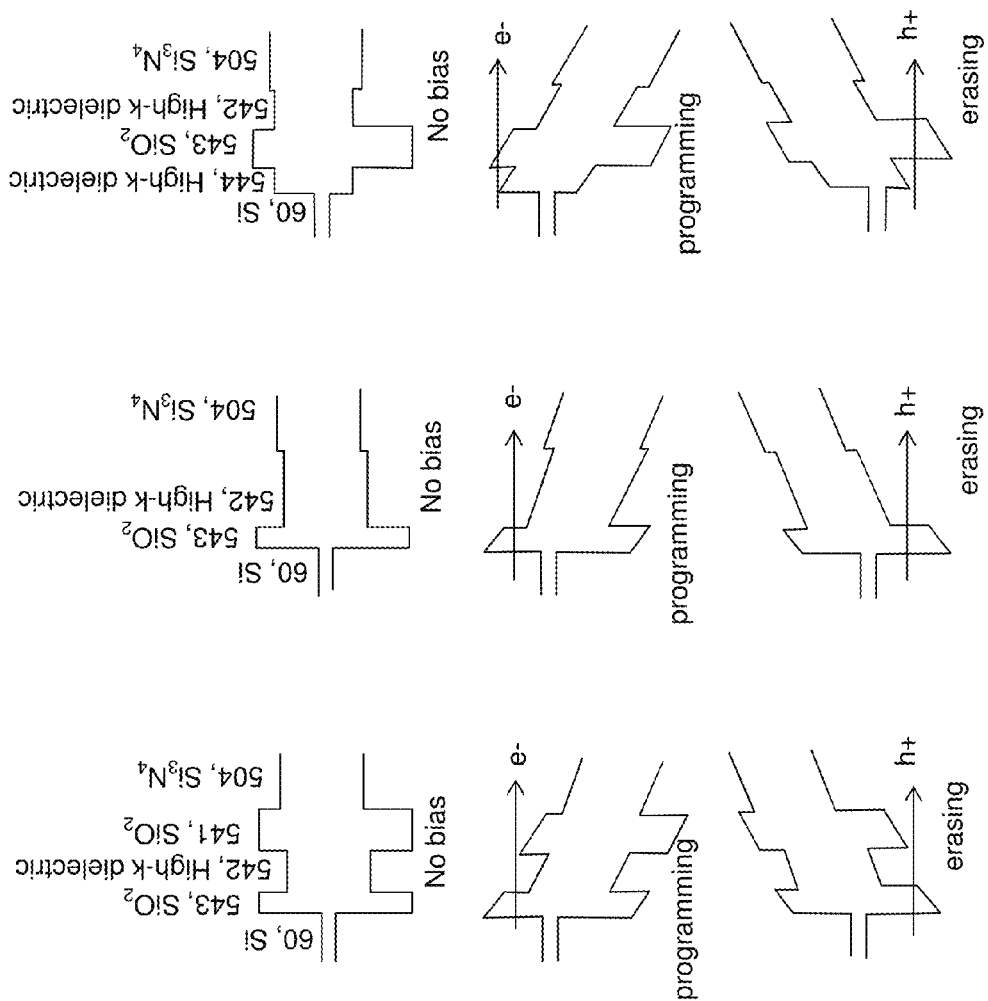

BAND GAP TAILORING FOR A TUNNELING DIELECTRIC FOR A THREE-DIMENSIONAL MEMORY STRUCTURE

FIELD

The present disclosure relates generally to the field of semiconductor devices and specifically to three dimensional memory devices, such as vertical NAND strings, and other three dimensional devices and methods of making thereof.

BACKGROUND

Three dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises a stack including an alternating plurality of electrically insulating layers and electrically conductive layers located over a substrate, a memory opening extending through the stack, a memory film located at a periphery of the memory opening, and a semiconductor channel contacting an inner sidewall of the memory film. The memory film comprises, from outside to inside, at least one blocking dielectric layer, at least one charge storage element, and a tunneling dielectric contacting the semiconductor channel. The tunneling dielectric comprises a layered stack including at least, from outside to inside, a dielectric metal oxide layer having a dielectric constant greater than 7.9 and a silicon oxide layer.

According to another aspect of the present disclosure, a method of manufacturing a monolithic three-dimensional memory device includes forming a stack of alternating plurality of first material layers and second material layers over a substrate and forming a memory opening through the stack. The method also includes forming at a periphery of the memory opening from outside to inside, at least one charge storage element and a tunneling dielectric, the tunneling dielectric including a dielectric metal oxide layer having a dielectric constant greater than 7.9 and a silicon oxide layer, and forming a semiconductor channel over an inner sidewall of the tunneling dielectric.

BRIEF DESCRIPTION OF THE DRAWINGS

FIGS. 2A-2F are sequential vertical cross-sectional views of a memory opening during formation of a first exemplary memory stack structure according to a first embodiment of the present disclosure.

FIGS. 3A and 3B are sequential vertical cross-sectional views of a memory opening during formation of a second exemplary memory stack structure according to a second embodiment of the present disclosure.

FIGS. 4A and 4B are sequential vertical cross-sectional views of a memory opening during formation of a third exemplary memory stack structure according to a third embodiment of the present disclosure.

FIGS. 6A and 6B are sequential vertical cross-sectional views of a memory opening during formation of a fifth exemplary memory stack structure according to a fifth embodiment of the present disclosure.

FIG. 9B is a top-down view of the exemplary structure of FIG. 9A. The vertical plane A-A' is the cut plane for the vertical cross-sectional view of FIG. 9A.

FIG. 12 illustrates band gap diagrams for a first exemplary tunneling dielectric according to an embodiment of the present disclosure.

FIG. 13 illustrates band gap diagrams for a second exemplary tunneling dielectric according to an embodiment of the present disclosure.

FIG. 14 illustrates band gap diagrams for a third exemplary tunneling dielectric according to an embodiment of the present disclosure.

DETAILED DESCRIPTION

As discussed above, the present disclosure is directed to three dimensional memory devices, such as vertical NAND strings, and other three dimensional devices and methods of making thereof, the various aspects of which are described below. The embodiments of the disclosure can be employed to form various structures including a multilevel metal interconnect structure, a non-limiting example of which includes semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three dimensional memory devices of the present disclosure include a monolithic three-dimensional NAND string memory device, and can be fabricated employing the various embodiments described herein.

Figure 1:
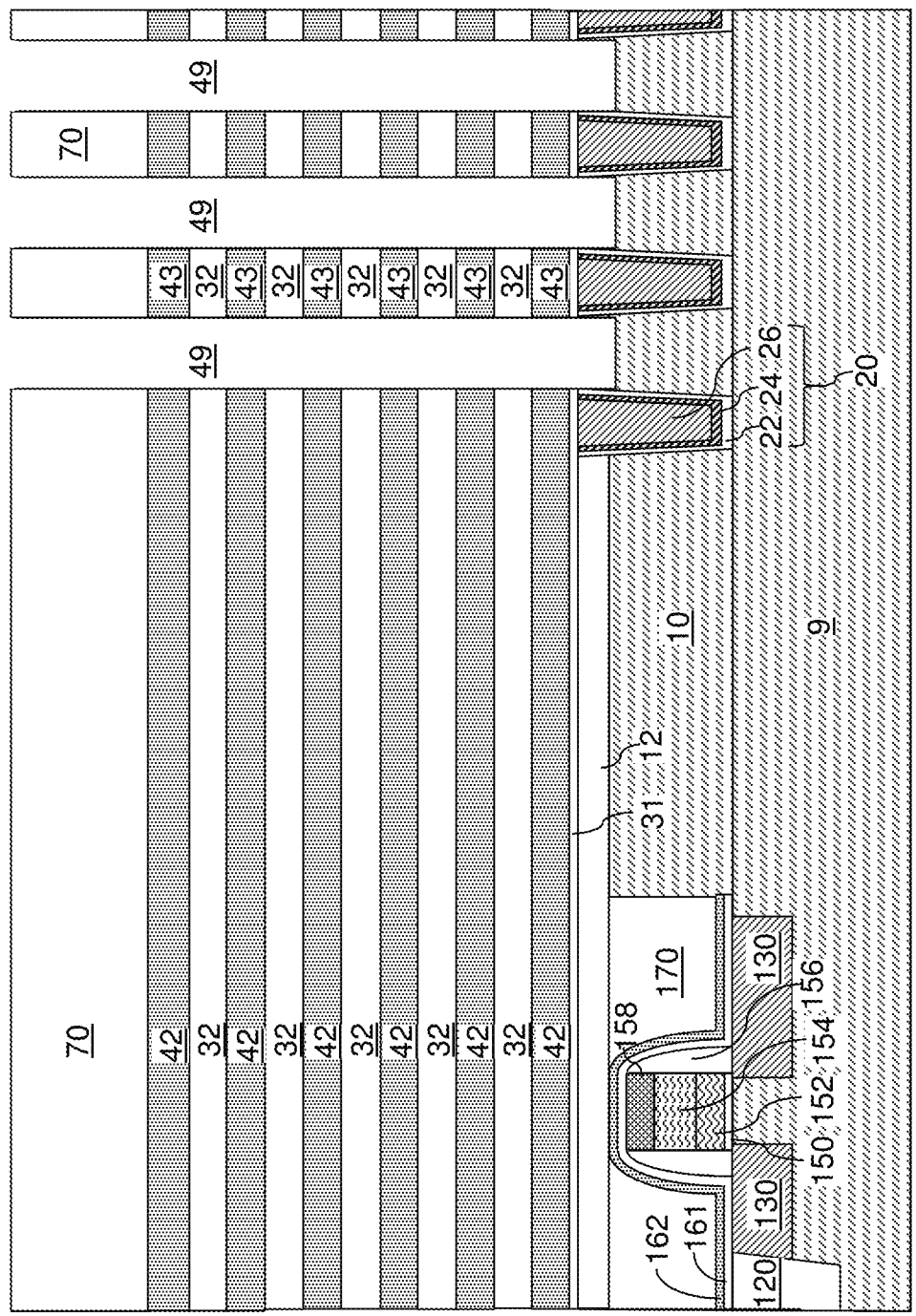
FIG. 1 is a vertical cross-sectional view of an exemplary structure after formation of a stack of alternating layers and memory openings through the stack according to an embodiment of the present disclosure.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The at least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

Optionally, a semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the insulating cap layer 70 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

A lower select gate structure 20 can be formed in each of the at least one shallow trench, for example, by forming a gate dielectric layer and at least one conductive material layer, and removing portions of the gate dielectric layer and the at least one conductive material layer from above the top surface of the dielectric pad layer 12, for example, by chemical mechanical planarization. Each lower select gate structure 20 can include a gate dielectric 22 and a gate electrode (24, 26). In one embodiment, each gate electrode (24, 26) can include a metallic liner 24 and a conductive material portion 26. The metallic liner 24 can include, for example, TiN, TaN, WN, or a combination thereof. The conductive material portion 26 can include, for example, W, Al, Cu, or combinations thereof. At least one optional shallow trench isolation structure (not shown) and/or at least one deep trench isolation structure (not shown) may be employed to provide electrical isolation among various semiconductor devices that are present, or are to be subsequently formed, on the substrate.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer (42L, 42C, 42U)) is formed over the top surface of the substrate, which can be, for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer 42. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide or a low dielectric constant material such as organosilicate glass.

The second material layers can include lower level second material layers formed at the levels of lower select gate electrodes to be subsequently formed, control gate level second material layers formed at the level of control gate electrodes to be subsequently formed, and upper level second material layers formed at the levels of upper select gate electrodes to be subsequently formed. For example, the lower level second material layers can be lower level sacrificial material layers 42L, the control gate level second material layers can be control gate level sacrificial material layers 42C, and the upper gate second material layers can be upper level sacrificial material layers 42U. The lower level sacrificial material layers 42L, the control gate level sacrificial material layers 42C, and the upper level sacrificial material layers 42U collectively constitute the sacrificial material layers 42, which, in conjunction with the insulator layers 32, form the alternating stack (32, 42).

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The etch chemistry of the anisotropic etch process employed to etch through the materials of the alternating stack (32, 42) can alternate between successive steps to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can extend to a top surface of the semiconductor material layer 10.

Figure 2A:
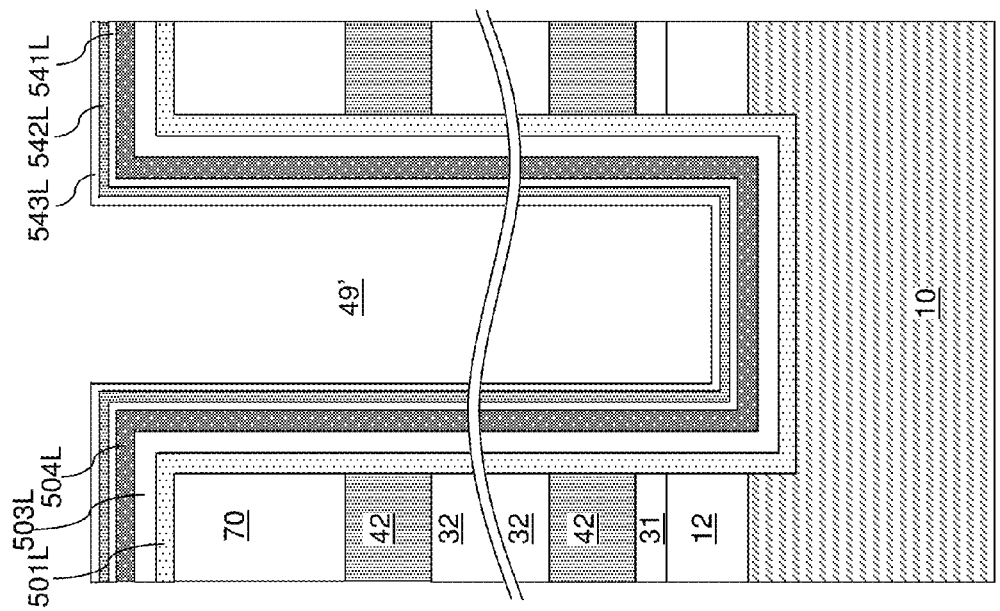

FIGS. 2A-2F illustrate a sequence of processing steps for forming a first exemplary memory stack structure within each memory opening 49 in the exemplary structure of FIG. 1 according to a first embodiment of the present disclosure. Referring to FIG. 2A, a memory opening is illustrated, which extends through the insulating cap layer 70, the alternating stack (32, 42), the dielectric cap layer 31, the dielectric pad layer 12, and optionally into an upper portion of the semiconductor material layer 10. A memory film can be formed at a periphery of each memory opening by sequentially forming at least one optional blocking dielectric layer (501L, 503L), a memory material layer 504L, and a tunneling dielectric (not shown in FIG. 2A, to be subsequently formed). Alternatively, only one blocking dielectric layer 501L or 503L may be formed. Alternatively, the blocking dielectric is not formed in the memory opening 49. Instead, one or more backside blocking dielectric layers are formed through a back side trench 79 in the back side recesses 43 over an outer sidewall of the at least one charge storage element after removal of the second material layers 42 and prior to deposition of the electrically conductive material (e.g., control gate electrodes) 46, as will be described in more detail below with reference to FIGS. 9A and 9B.

Specifically, At least one blocking dielectric layer (501L, 503L) and a memory material layer 504L can be sequentially deposited. For example, a first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

A second blocking dielectric layer 503L is formed on the first blocking dielectric 501. The second blocking dielectric layer 503L includes a dielectric material that is different from the dielectric material of the first blocking dielectric 501. In one embodiment, the second blocking dielectric layer 503L can include silicon oxide, a dielectric metal oxide having a different composition than the first blocking dielectric 501, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. In an illustrative example, the at least one blocking dielectric layer (501L, 503L) can comprise a stack, from outside to inside, a dielectric metal oxide layer and a silicon oxide layer. In one embodiment, the effective oxide thickness of the at least one blocking dielectric layer (501L, 503L) can be greater than an effective oxide thickness of a tunneling dielectric to be subsequently formed.

Subsequently, a memory material layer 504L can be deposited. In one embodiment, the memory material layer 504L can be a charge trapping material including a dielectric charge trapping material, which can be, for example, silicon nitride. For example, the memory material layer 504L can include silicon nitride that is deposited directly on surfaces of the at least one blocking dielectric layer (501L, 503L). Alternatively, the memory material layer 504L can include a conductive material such as doped polysilicon or a metallic material that is patterned into multiple electrically isolated portions (i.e., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The vertical portions of the memory material layer 504L constitute at least one charge storage element in which electrical charges can be stored upon fabrication of a three-dimensional memory device. The thickness of the memory material layer 504L can be in a range from 2 nm to 20 nm, although lesser and greater thicknesses can also be employed. A cavity 49' is present in the volume of each memory opening that is not filled with the at least one blocking dielectric layer (501L, 503L) and the memory material layer 504L.

Figure 2B:
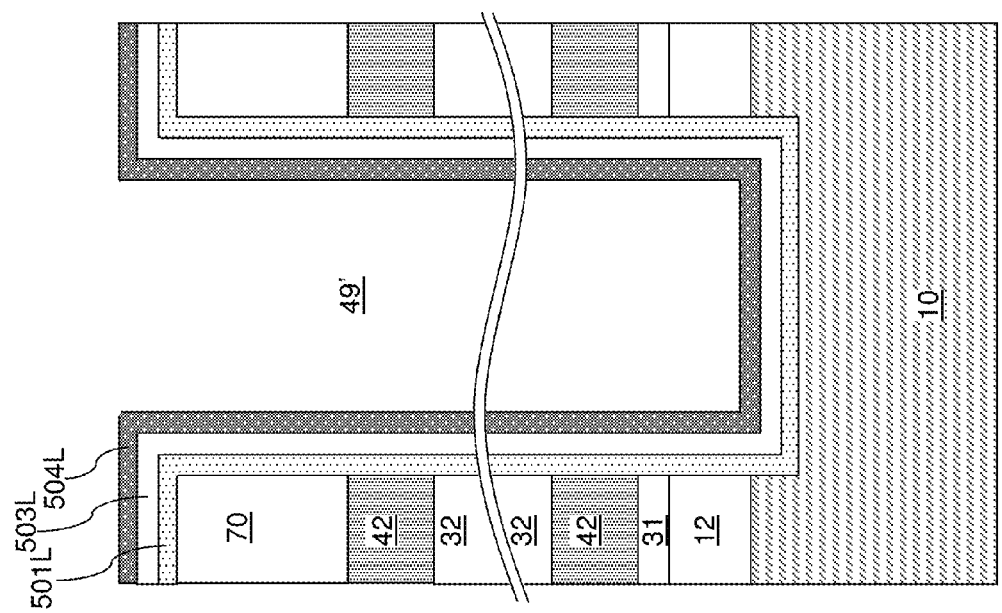

Referring to FIG. 2B, tunneling dielectric layers (541L, 542L, 543L) are formed directly on the memory material layer 504L which includes at least one charge storage element. The tunneling dielectric layers (541L, 542L, 543L) include a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed.

In one embodiment, the tunneling dielectric layers (541L, 542L, 543L) can include a stack of a first tunneling dielectric layer 541L, a second tunneling dielectric layer 542L, and a third tunneling dielectric layer 543L that are sequentially deposited on the memory material layer 504L. The first tunneling dielectric layer 541L can be a silicon oxide layer having a thickness in a range from 0.5 nm to 5 nm. The first tunneling dielectric layer 541L can be formed by a conformal deposition method such as low pressure chemical vapor deposition (LPCVD) employing a precursor such as tetraethylorthosilicate (TEOS).

The second tunneling dielectric layer 542L can include a dielectric metal oxide. In one embodiment, the second tunneling dielectric layer 542L can comprise a dielectric metal oxide layer including a dielectric metal oxide material having a dielectric constant greater than 7.9. In one embodiment, the dielectric metal oxide of the second tunneling dielectric layer 542L may consist essentially of the at least one metallic element and oxygen, or may consist essentially of the at least one metallic element, oxygen, and at least one non-metallic element such as nitrogen. The dielectric metal oxide materials that can be employed for the second tunneling dielectric layer 542L include, but are not limited to, hafnium oxide ($HfO_2$), lanthanum oxide ($LaO_2$), yttrium oxide ($Y_2O_3$), tantalum oxide ($Ta_2O_5$), aluminum oxide ($Al_2O_3$), silicates thereof, nitrogen-doped compounds thereof, alloys thereof, and stacks thereof. The second tunneling dielectric layer 542L can be deposited, for example, by chemical vapor deposition (CVD), atomic layer deposition (ALD), pulsed laser deposition (PLD), liquid source misted chemical deposition, or a combination thereof. In one embodiment, the second tunneling dielectric layer 542L can be a dielectric metal oxide layer formed by deposition of an oxide of at least one metal selected from Al, transition metal elements, Lanthanides, and Actinides. In one embodiment, the oxide of the at least one metal consists essentially of the at least one metal and oxygen, or of the at least one metal, oxygen, and nitrogen. The thickness of the second tunneling dielectric layer 542L can be in a range from 0.5 nm to 5 nm, although lesser and greater thicknesses can also be employed. In one embodiment, the second tunneling dielectric layer 542L includes hafnium oxide or lanthanum oxide.

The third tunneling dielectric layer 543L can be a silicon oxide layer having a thickness in a range from 0.5 nm to 5 nm. The third tunneling dielectric layer 543L can be formed by a conformal deposition method such as low pressure chemical vapor deposition (LPCVD) employing a precursor such as tetraethylorthosilicate. The third tunneling dielectric layer 543L can be deposited directly on the inner sidewalls of the second tunneling dielectric layer 542L. As used herein, an "outer layer" is more proximal to the sidewall of the memory opening than an "inner layer", and an "inner" surface of an element within a memory opening is more proximal to the central vertical axis of the memory opening than an "outer" surface of the element.

Referring to FIG. 2C, an optional first semiconductor channel layer 601L can be deposited on the tunneling dielectric layers (541L, 542L, 543L). The optional first semiconductor channel layer 601L, if present, includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed.

Referring to FIG. 2D, the optional first semiconductor channel layer 601L, the tunneling dielectric layers (541L, 542L, 543L), the memory material layer 504L, and the at least one blocking dielectric layer (501L, 503L) are sequentially anisotropically etched employing at least one anisotropic etch process. The portions of the first semiconductor channel layer 601L, the tunneling dielectric layers (541L, 542L, 543L), the memory material layer 504L, and the at least one blocking dielectric layer (501L, 503L) located above the top surface of the insulating cap layer 70 can be removed by the at least one anisotropic etch process. Further, the portions of the first semiconductor channel layer 601L, the tunneling dielectric layers (541L, 542L, 543L), the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layers (541L, 542L, 543L), the memory material layer 504L, and the at least one blocking dielectric layer 503L can be etched by anisotropic etch process.

Each remaining portion of the first semiconductor channel layer 601L in a memory opening constitutes a first semiconductor channel portion 601. Each remaining portion of the first tunneling dielectric layer 541L in a memory opening constitutes a first tunneling dielectric 541. Each remaining portion of the second tunneling dielectric layer 542L in a memory opening constitutes a second tunneling dielectric 542. Each remaining portion of the third tunneling dielectric layer 543L in a memory opening constitutes a third tunneling dielectric 543. A first tunneling dielectric 541, a second tunneling dielectric 542, and a third tunneling dielectric 543 within a same memory opening (e.g., memory hole) collectively constitute a tunneling dielectric 54 of a memory stack structure to be formed in the memory opening. Each remaining portion of the memory material layer 504L in a memory opening is herein referred to as a charge storage element 504. In one embodiment, the charge storage element 504 can be a contiguous layer, i.e., can be a charge storage layer. Each remaining portion of the second blocking dielectric layer 503L within a memory opening is herein referred to as a second blocking dielectric 503. Each remaining portion of the first blocking dielectric layer 501L within a memory opening is herein referred to as a second blocking dielectric 501. A first blocking dielectric 501 and a second blocking dielectric 503 within a same memory opening collectively constitutes a blocking dielectric 502 for the memory stack structure to be formed in the memory opening.

A surface of the semiconductor material layer 10 can be physically exposed underneath the opening through the first semiconductor channel portion 601, the tunneling dielectric 54, the at least one charge storage element 504, and the blocking dielectric 502. Optionally, the physically exposed semiconductor surface at the bottom of each cavity 49' can be vertically recessed so that the recessed semiconductor surface underneath the cavity 49' is vertically offset from the topmost surface of the semiconductor material layer 10. The tunneling dielectric 54 is embedded within the at least one charge storage element 504. The at least one charge storage element 504 can comprise a charge trapping material or a floating gate material.

In one embodiment, the first semiconductor channel portion 601, the tunneling dielectric 54, the at least one charge storage element 504, and the blocking dielectric 502 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2E, a second semiconductor channel layer 602L can be deposited directly on the semiconductor surface of the semiconductor material layer 10 in the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

In case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2F, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 54 is embedded within a charge storage element 504, and laterally surrounds a portion of the semiconductor channel 60. Each adjoining set of a first blocking dielectric 501, a second blocking dielectric 503, at least one charge storage element 504, and a tunneling dielectric 54 collectively constitute a memory film 50, which can store electrical charges with a macroscopic retention time. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Referring to FIG. 3A, an in-process structure for formation of a second exemplary memory stack structure according to a second embodiment of the present disclosure is illustrated, which can be formed within each memory opening 49 in the exemplary structure of FIG. 1. As used herein, an "in-process" structure refers to a transient structure that is manufactured during a processing step prior to the final step within a sequence of processing steps. The in-process structure illustrated in FIG. 3A can be derived from the in-process structure of the first embodiment by omitting formation of a first tunneling dielectric layer 541L.

Specifically, the step of formation of the first tunneling dielectric layer 541L can be omitted from the sequential processing steps illustrated in FIGS. 2A, 2B, and 2C to form the in-process structure illustrated in FIG. 3A. Thus, the second tunneling dielectric layer 542L is formed directly on the memory material layer 504L, the third tunneling dielectric layer 543L is formed on the second tunneling dielectric layer 542L, and the optional first semiconductor channel layer 601L can be formed directly on surfaces of the third tunneling dielectric material layer 543L. Each of the second tunneling dielectric layer 542L and the third tunneling dielectric layer 543L can have the same composition as in the first embodiment. The thickness of the second tunneling dielectric layer 542L of the second embodiment can be in a range from 0.5 nm to 5 nm, although lesser and greater thicknesses can also be employed. The thickness of the third tunneling dielectric layer 543L of the second embodiment can be in a range from 0.5 nm to 5 nm, although lesser and greater thicknesses can also be employed. In one embodiment, the second tunneling dielectric layer 542L can be a dielectric metal oxide layer and the third tunneling dielectric layer 543L can be a silicon oxide layer.

Referring to FIG. 3B, the processing steps of FIGS. 2D, 2E, and 2F can be sequentially performed to form the second exemplary memory stack structure illustrated in FIG. 3B. The tunneling dielectric 54 can comprise a second tunneling dielectric 542 and a third tunneling dielectric 543. In one embodiment, the tunneling dielectric 54 can consist of a second tunneling dielectric 542 (which can be a dielectric metal oxide layer) and a third tunneling dielectric 543 (which can be a silicon oxide layer).

Referring to FIG. 4A, an in-process structure for formation of a third exemplary memory stack structure according to a third embodiment of the present disclosure is illustrated, which can be formed within each memory opening 49 in the exemplary structure of FIG. 1. The in-process structure illustrated in FIG. 4A can be derived from the in-process structure of the first embodiment by omitting formation of a first tunneling dielectric layer 541L and by adding the processing step of forming a fourth tunneling dielectric layer 544L after formation of a third tunneling dielectric layer 543L and prior to formation of an optional first semiconductor channel layer 601L.

Specifically, the step of formation of the first tunneling dielectric layer 541L can be omitted from the sequential processing steps illustrated in FIGS. 2A, 2B, and 2C and a processing step for deposition of a fourth tunneling dielectric layer 544L can be added after formation of the third tunneling dielectric layer 543L and prior to formation of the memory material layer 504L to form the in-process structure illustrated in FIG. 4A. Thus, the second tunneling dielectric layer 542L is formed directly on the memory material layer 504L, the third tunneling dielectric layer 543L is formed on the second tunneling dielectric layer 542L, the fourth tunneling dielectric layer 544L is formed on the third tunneling dielectric layer 543L, and the optional first semiconductor channel layer 601L can be formed directly on surfaces of the fourth tunneling dielectric material layer 544L. Each of the second tunneling dielectric layer 542L and the third tunneling dielectric layer 543L can have the same composition as in the first embodiment. The thickness of the second tunneling dielectric layer 542L of the third embodiment can be in a range from 0.5 nm to 5 nm, although lesser and greater thicknesses can also be employed. The thickness of the third tunneling dielectric layer 543L of the third embodiment can be in a range from 0.5 nm to 5 nm, although lesser and greater thicknesses can also be employed. In one embodiment, the second tunneling dielectric layer 542L can be a dielectric metal oxide layer and the third tunneling dielectric layer 543L can be a silicon oxide layer.

The fourth tunneling dielectric layer 544L can include a dielectric metal oxide. In one embodiment, the fourth tunneling dielectric layer 544L can comprise a dielectric metal oxide layer including a dielectric metal oxide material having a dielectric constant greater than 7.9. In one embodiment, the dielectric metal oxide of the fourth tunneling dielectric layer 544L may consist essentially of the at least one metallic element and oxygen, or may consist essentially of the at least one metallic element, oxygen, and at least one non-metallic element such as nitrogen. The dielectric metal oxide materials that can be employed for the fourth tunneling dielectric layer 544L include any dielectric metal oxide material that can be employed for the second tunneling dielectric layer 542L as described above. The fourth tunneling dielectric layer 544L can be deposited, for example, by chemical vapor deposition (CVD), atomic layer deposition (ALD), pulsed laser deposition (PLD), liquid source misted chemical deposition, or a combination thereof. In one embodiment, the fourth tunneling dielectric layer 544L can be a dielectric metal oxide layer formed by deposition of an oxide of at least one metal selected from Al, transition metal elements, Lanthanides, and Actinides. In one embodiment, the oxide of the at least one metal consists essentially of the at least one metal and oxygen, or of the at least one metal, oxygen, and nitrogen. The thickness of the fourth tunneling dielectric layer 544L can be in a range from 0.5 nm to 5 nm, although lesser and greater thicknesses can also be employed. In one embodiment, the fourth tunneling dielectric layer 544L includes hafnium oxide or lanthanum oxide.

Referring to FIG. 4B, the processing steps of FIGS. 2D, 2E, and 2F can be sequentially performed to form the third exemplary memory stack structure illustrated in FIG. 4B. The tunneling dielectric 54 can comprise a second tunneling dielectric 542, a third tunneling dielectric 543, and a fourth tunneling dielectric 544, which is a remaining portion of the fourth tunneling dielectric layer 544L after the anisotropic etch that removes horizontal portions of the various material layers (601L, 544L, 543L, 542L, 503L, 501L). In one embodiment, the tunneling dielectric 54 can consist of a second tunneling dielectric 542 (which can be a first dielectric metal oxide layer), a third tunneling dielectric 543 (which can be a silicon oxide layer), and a fourth tunneling dielectric 544 (which can be a second dielectric metal oxide layer).

Figure 5B:
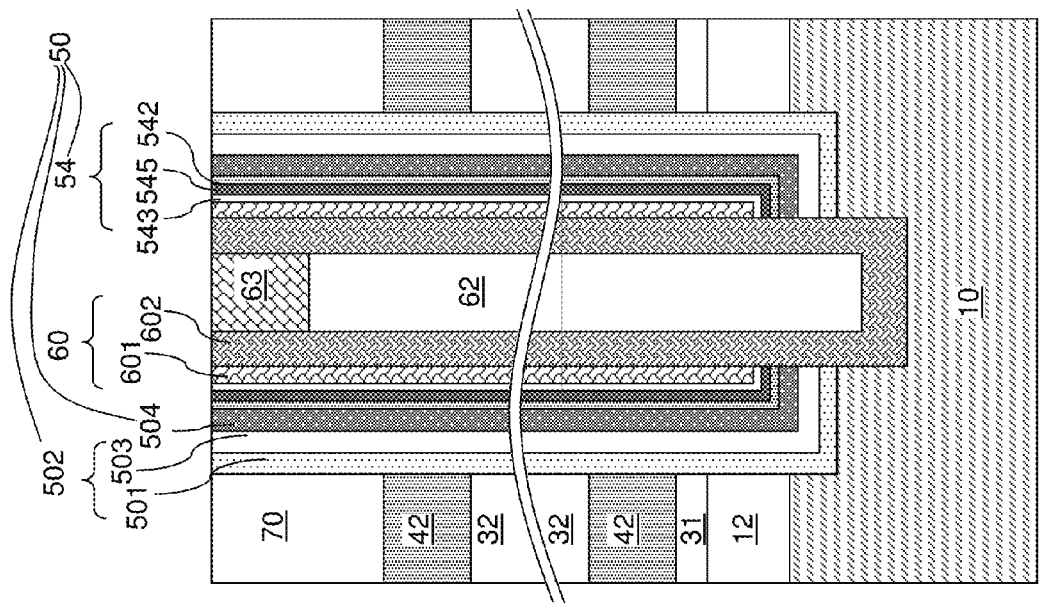
FIGS. 5A and 5B are sequential vertical cross-sectional views of a memory opening during formation of a fourth exemplary memory stack structure according to a fourth embodiment of the present disclosure.
Figure 5A:
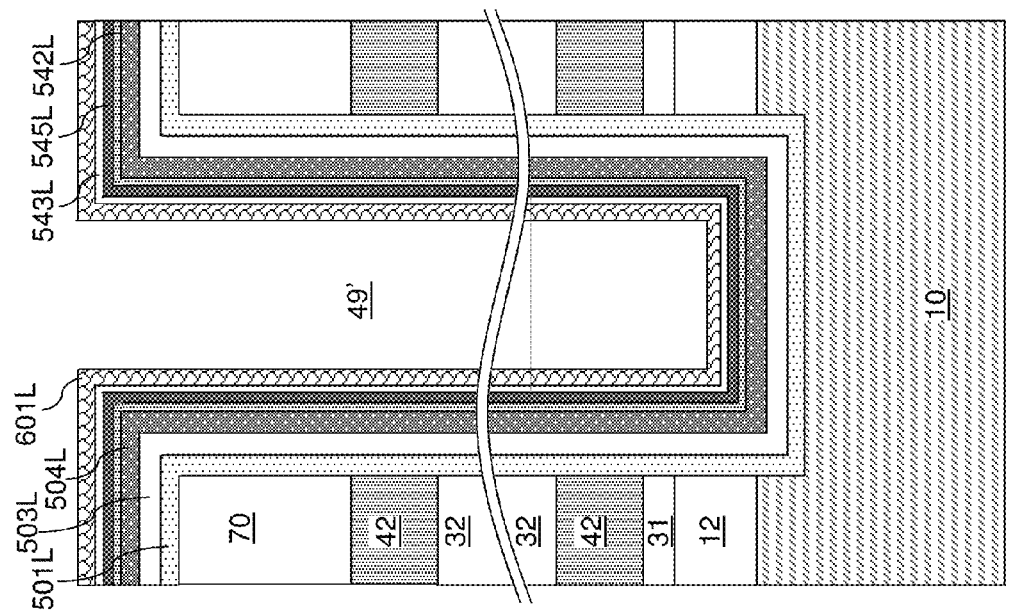

Referring to FIG. 5A, an in-process structure for formation of a fourth exemplary memory stack structure according to a fourth embodiment of the present disclosure is illustrated, which can be formed within each memory opening 49 in the exemplary structure of FIG. 1. The in-process structure illustrated in FIG. 5A can be derived from the in-process structure of the first embodiment by omitting formation of a first tunneling dielectric layer 541L and by adding the processing step of forming a silicon nitride tunneling dielectric layer 545L after formation of the second tunneling dielectric layer 542L and prior to formation of an the third tunneling dielectric layer 543L.

Specifically, the step of formation of the first tunneling dielectric layer 541L can be omitted from the sequential processing steps illustrated in FIGS. 2A, 2B, and 2C. A processing step for deposition of a silicon nitride tunneling dielectric layer 545L can be added after formation of the second tunneling dielectric layer 542L and prior to formation of the third tunneling dielectric layer 543L form the in-process structure illustrated in FIG. 5A. Thus, the second tunneling dielectric layer 542L is formed directly on the memory material layer 504L, the silicon nitride tunneling dielectric layer 545L is formed directly on the second tunneling dielectric layer 542L, the third tunneling dielectric layer 543L is formed on the silicon nitride tunneling dielectric layer 545L, and the optional first semiconductor channel layer 601L can be formed directly on surfaces of the third tunneling dielectric material layer 543L. Each of the second tunneling dielectric layer 542L and the third tunneling dielectric layer 543L can have the same composition as in the first embodiment. The thickness of the second tunneling dielectric layer 542L of the fourth embodiment can be in a range from 0.5 nm to 5 nm, although lesser and greater thicknesses can also be employed. The thickness of the third tunneling dielectric layer 543L of the fourth embodiment can be in a range from 0.5 nm to 5 nm, although lesser and greater thicknesses can also be employed. In one embodiment, the second tunneling dielectric layer 542L can be a dielectric metal oxide layer and the third tunneling dielectric layer 543L can be a silicon oxide layer.

The silicon oxide tunneling dielectric layer 545L includes silicon nitride, which can be deposited by a conformal deposition process such as chemical vapor deposition (CVD). The thickness of the silicon nitride tunneling dielectric layer 545L can be in a range from 0.5 nm to 5 nm, although lesser and greater thicknesses can also be employed.

Referring to FIG. 5B, the processing steps of FIGS. 2D, 2E, and 2F can be sequentially performed to form the fourth exemplary memory stack structure illustrated in FIG. 5B. The tunneling dielectric 54 can comprise a second tunneling dielectric 542, a silicon nitride tunneling dielectric 545, and a third tunneling dielectric 543. The silicon nitride tunneling dielectric is a remaining portion of the silicon nitride tunneling dielectric layer 545L after the anisotropic etch that removes horizontal portions of the various material layers (601L, 543L, 545L, 542L, 503L, 501L). In one embodiment, the tunneling dielectric 54 can consist of a second tunneling dielectric 542 (which can be a dielectric metal oxide layer), a silicon nitride tunneling dielectric 545 (which can be a silicon nitride layer), and a third tunneling dielectric 543 (which can be a silicon oxide layer).

Referring to FIG. 6A, an in-process structure for formation of a fifth exemplary memory stack structure according to a fifth embodiment of the present disclosure is illustrated, which can be formed within each memory opening 49 in the exemplary structure of FIG. 1. The in-process structure illustrated in FIG. 6A can be derived from the in-process structure of the third embodiment by reversing the order of formation between the third tunneling dielectric layer 543L and the fourth tunneling dielectric layer 544L. Thus, the second tunneling dielectric layer 542L is formed directly on the memory material layer 504L, the fourth tunneling dielectric layer 544L is formed directly on the second tunneling dielectric layer 542L, the third tunneling dielectric layer 543L is formed on the fourth tunneling dielectric layer 544L, and the optional first semiconductor channel layer 601L can be formed directly on surfaces of the third tunneling dielectric material layer 543L. Each of the second tunneling dielectric layer 542L, the third tunneling dielectric layer 543L, and the fourth tunneling dielectric layer 544L can have the same composition as in the third embodiment. The thickness of the second tunneling dielectric layer 542L of the fifth embodiment can be in a range from 0.5 nm to 5 nm, although lesser and greater thicknesses can also be employed. The thickness of the third tunneling dielectric layer 543L of the fifth embodiment can be in a range from 0.5 nm to 5 nm, although lesser and greater thicknesses can also be employed. The thickness of the fourth tunneling dielectric layer 544L of the fifth embodiment can be in a range from 0.5 nm to 5 nm, although lesser and greater thicknesses can also be employed. In one embodiment, the second tunneling dielectric layer 542L can be a first dielectric metal oxide layer including a first dielectric metal oxide, the fourth tunneling dielectric layer 544L can be a second dielectric material oxide layer including a second dielectric metal oxide (e.g., lanthanum oxide) that is different from the first dielectric metal oxide (e.g., hafnium oxide), and the third tunneling dielectric layer 543L can be a silicon oxide layer.

Referring to FIG. 6B, the processing steps of FIGS. 2D, 2E, and 2F can be sequentially performed to form the fifth exemplary memory stack structure illustrated in FIG. 6B. The tunneling dielectric 54 can comprise a second tunneling dielectric 542, a fourth tunneling dielectric 544, and a third tunneling dielectric 543. In one embodiment, the tunneling dielectric 54 can consist of a second tunneling dielectric 542 (which can be a first dielectric metal oxide layer), a fourth tunneling dielectric 544 (which can be a second dielectric metal oxide layer having a different composition than the first dielectric metal oxide layer), and a third tunneling dielectric 543 (which can be a silicon oxide layer).

Figure 7:
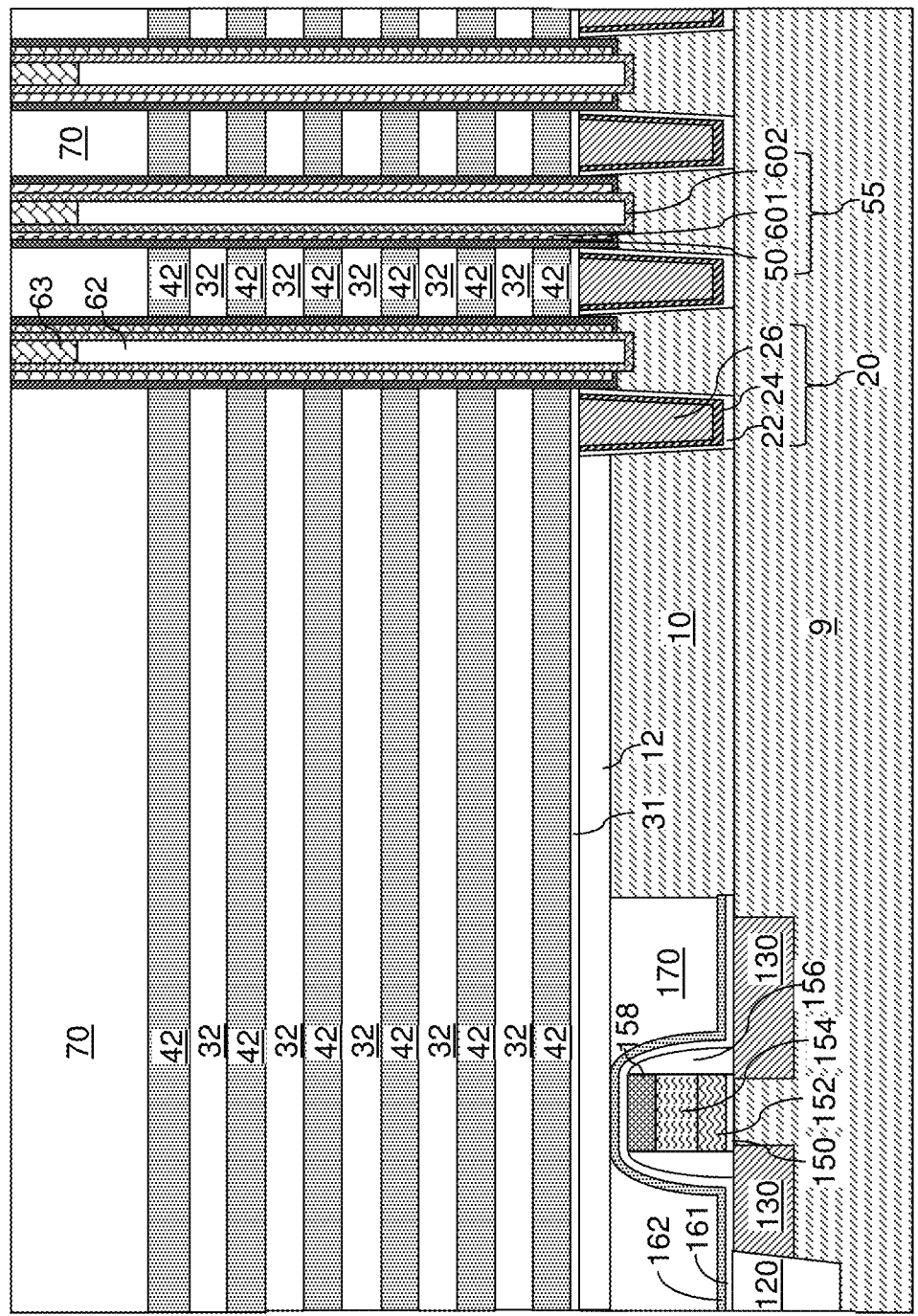
FIG. 7 is a vertical cross-sectional view of the exemplary structure after formation of memory stack structures according to an embodiment of the present disclosure.

Referring to FIG. 7, any of the first, second, third, fourth and fifth memory stack structures illustrated in FIGS. 2F, 3B, 4B, 5B, and 6B can be incorporated into the exemplary structure of FIG. 1 to provide the exemplary structure illustrated in FIG. 7. Each memory stack structure 55 includes a memory film 50 and a semiconductor channel (601, 602). The memory stack structures 55 can be a set of first exemplary memory stack structures according to the first embodiment, a set of second exemplary memory stack structures according to the second embodiment, a set of third exemplary memory stack structures according to the third embodiment, a set of fourth exemplary memory stack structures according to the fourth embodiment, or a set of fifth exemplary memory stack structures according to the fifth embodiment.

Figure 8:
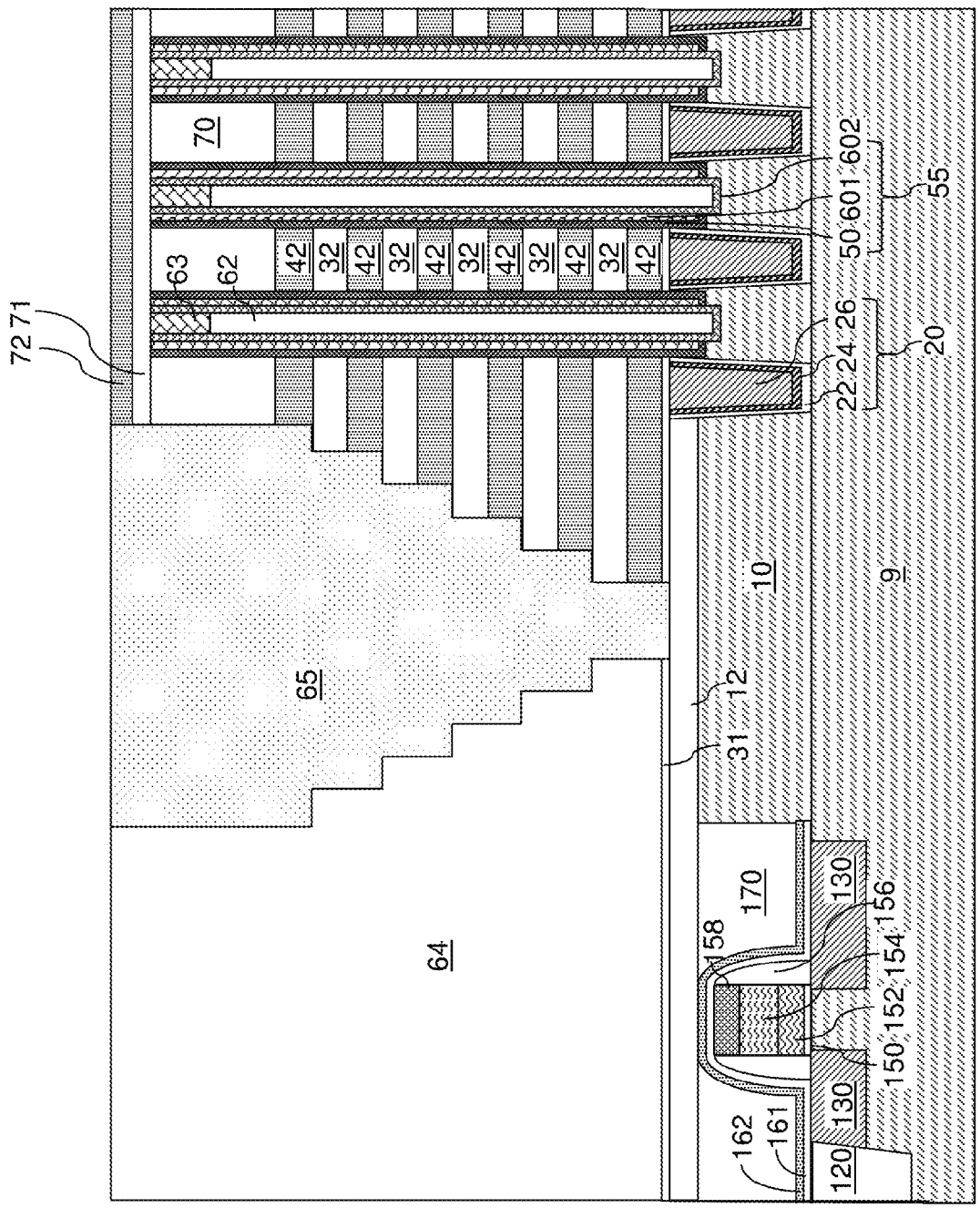
FIG. 8 is a vertical cross-sectional view of the exemplary structure after formation of a stepped terrace and a retro-stepped dielectric fill material portion according to an embodiment of the present disclosure.

Referring to FIG. 8, at least one dielectric cap layer (71, 72) can be optionally formed over the planarization dielectric layer 70. In one embodiment, the at least one dielectric cap layer (71, 72) can include a first dielectric cap layer 71 and a second dielectric cap layer 72. In one embodiment, the first and second dielectric cap layers (71, 72) can include dielectric materials such as silicon oxide, a dielectric metal oxide, and/or silicon nitride.

Optionally, a portion of the at least one dielectric cap layer (71, 72) and the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed. Underlying portions of the dielectric cap layer 31 and the dielectric pad layer 12 may, or may not, be removed during formation of the trench. Subsequently, the trench can be filled with an optional dielectric material such as silicon oxide. Excess portions of the dielectric material can be removed from above the top surface of the at least one dielectric cap layer (71, 72) by a planarization process such as chemical mechanical planarization and/or a recess etch. The top surfaces of the at least one dielectric cap layer (71, 72) can be employed as a stopping surface during the planarization. The remaining dielectric material in the trench constitutes a dielectric material portion 64.

Figure 9A:
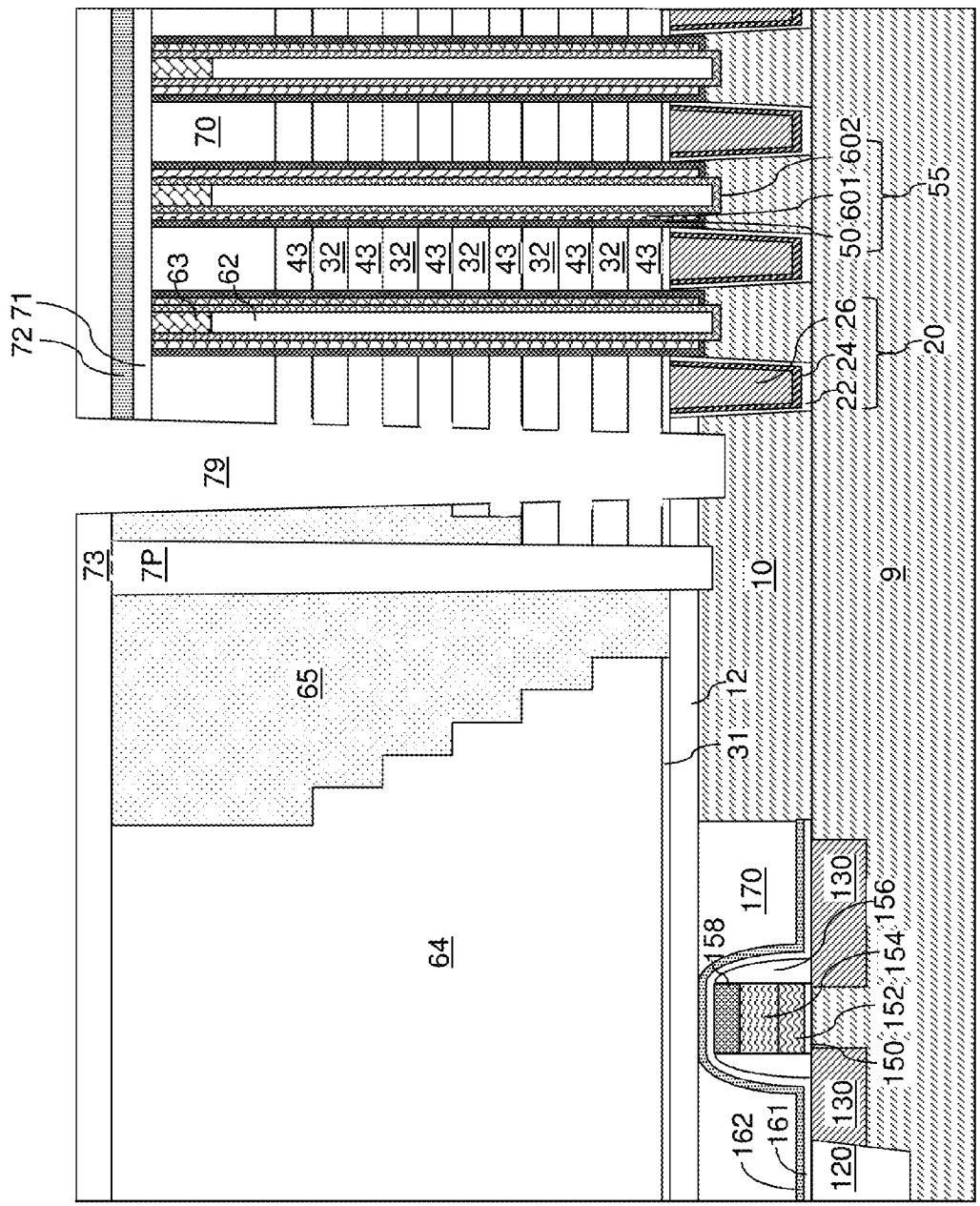
FIG. 9A is a vertical cross-sectional view of the exemplary structure after formation of a backside via cavity and backside recesses according to an embodiment of the present disclosure.

Referring to FIGS. 9A and 9B, a stepped cavity can be formed within a contact region, which can straddle the dielectric material portion 64 and a portion of the alternating stack (32, 42). Alternatively, the dielectric material portion 64 may be omitted and the stepped cavity may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the at least one dielectric cap layer (71, 72), for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

At least one dielectric support pillar 7P may be optionally formed through the retro-stepped dielectric material portion 65 and/or through the alternating stack (32, 42). In one embodiment, the at least one dielectric support pillar 7P can be formed in a contact region 300, which is located adjacent to a device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42. In one embodiment, the at least one dielectric support pillar can include silicon oxide and/or a dielectric metal oxide such as aluminum oxide. In one embodiment, the portion of the dielectric material that is deposited over the at least one dielectric cap layer (71, 72) concurrently with deposition of the at least one dielectric support pillar 7P can be present over the at least one dielectric cap layer (71, 72) as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer (71, 72)

concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer (71, 72) can be physically exposed.

A photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region (not shown) may be formed by implantation of dopant atoms into a portion of the semiconductor material layer 10 through the backside contact trench 79.

An etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. In another embodiment, the lateral dimension of each backside recess 43 can be comparable with, or smaller than, the height of the backside recess 43. As an example, the lateral dimension of a backside recess 43 depends on the distance between the trench 79 and adjacent memory opening, the distance between memory openings, and the size of memory openings. Since the size (e.g., the diameter) of memory openings may vary from top to bottom of the stack (e.g., bigger on the top, and smaller on the bottom), the lateral dimension of a backside recess 43 may vary also from top to bottom of the stack.

A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three dimensional NAND strings having a plurality of device levels disposed above the substrate (9, 10). In this case, each backside recess 43 can define a space for receiving a respective word line of the array of monolithic three dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout.

Figure 10:
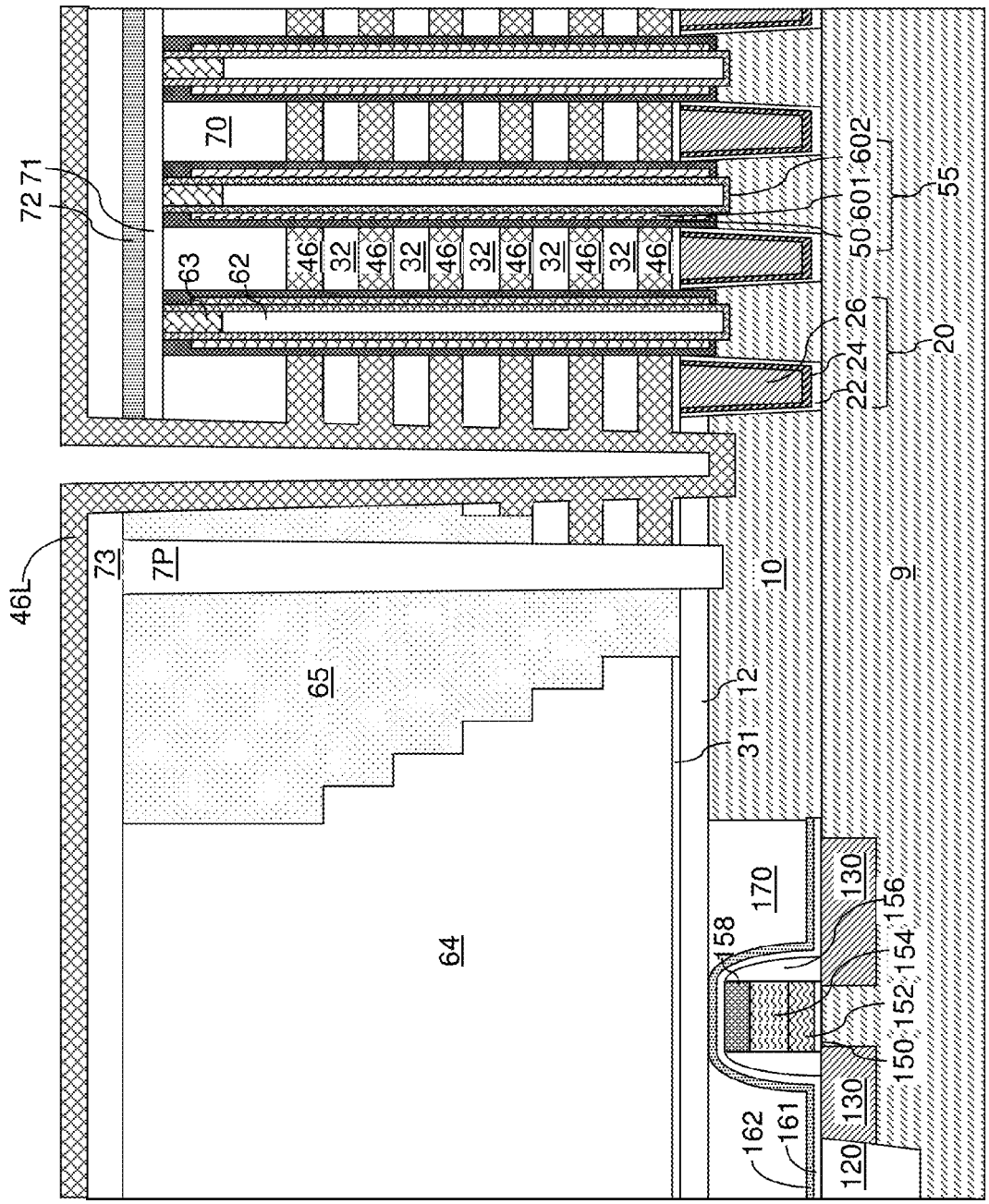
FIG. 10 is a vertical cross-sectional view of the exemplary structure after formation of electrically conductive layers according to an embodiment of the present disclosure.

Referring to FIG. 10, a conductive material can be deposited in the plurality of backside recesses 43, on sidewalls of the at least one the backside contact trench 79, and over the top surface of the dielectric pillar material layer 73 (or the topmost layer of the exemplary structure in case the dielectric pillar material layer 73 is not employed). As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 43 include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses 43 can be selected from tungsten and a combination of titanium nitride and tungsten. In one embodiment, the conductive material can be deposited by chemical vapor deposition.

A plurality of electrically conductive layers 46 is present in the plurality of backside recesses 43, and a contiguous conductive material layer 46L can be formed on the sidewalls of each backside contact trench 79 and over the dielectric pillar material layer 73 (or the topmost layer of the exemplary structure in case the dielectric pillar material layer 73 is not employed). Thus, at least a portion of each sacrificial material layer 42 can be replaced with an electrically conductive layer 46, which is a conductive material portion.

Figure 11A:
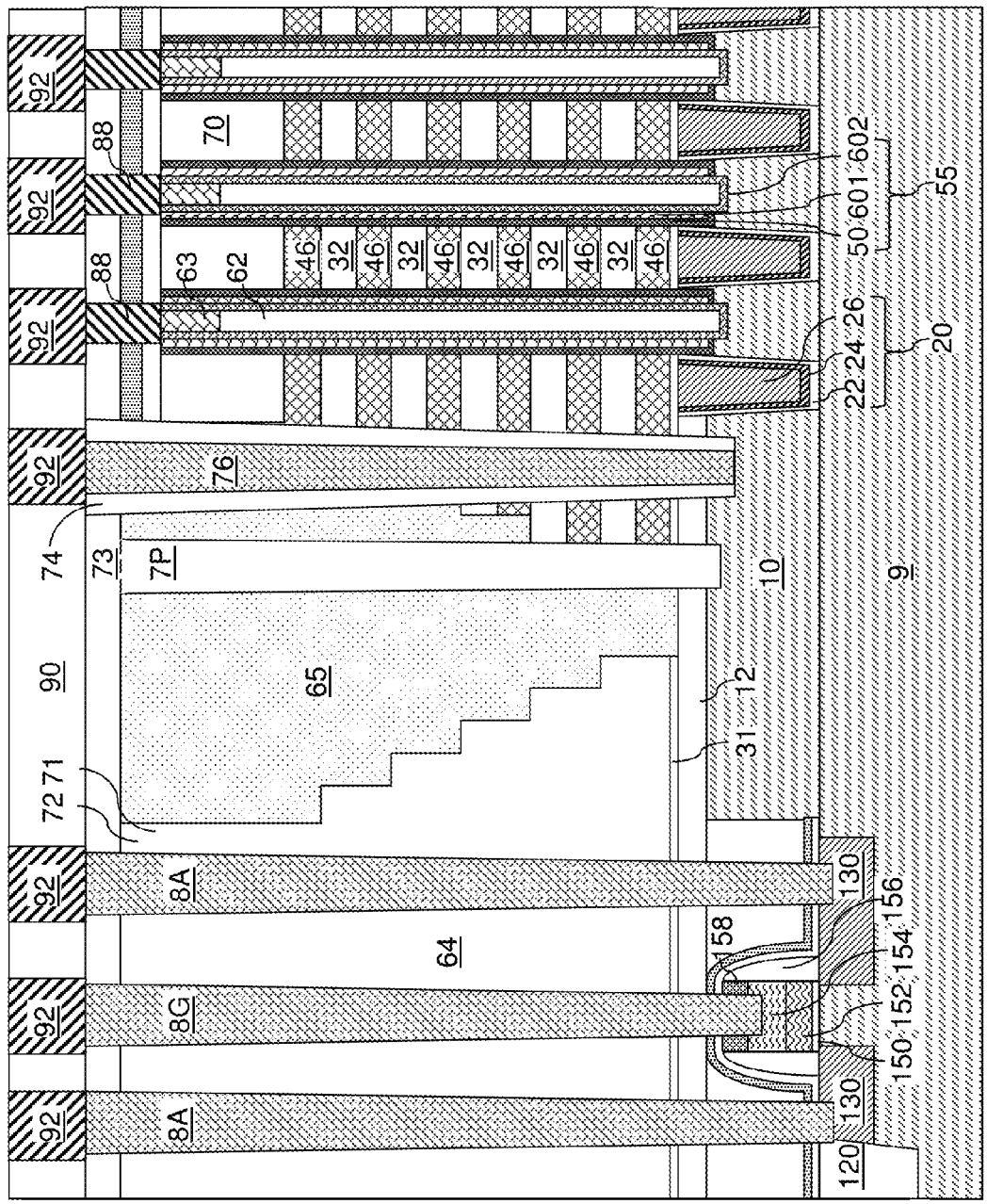
FIGS. 11A and 11B are vertical cross-sectional views of regions of the exemplary structure after formation of a backside via spacer, a backside via contact structure, and conductive line structures according to an embodiment of the present disclosure.
Figure 11B:
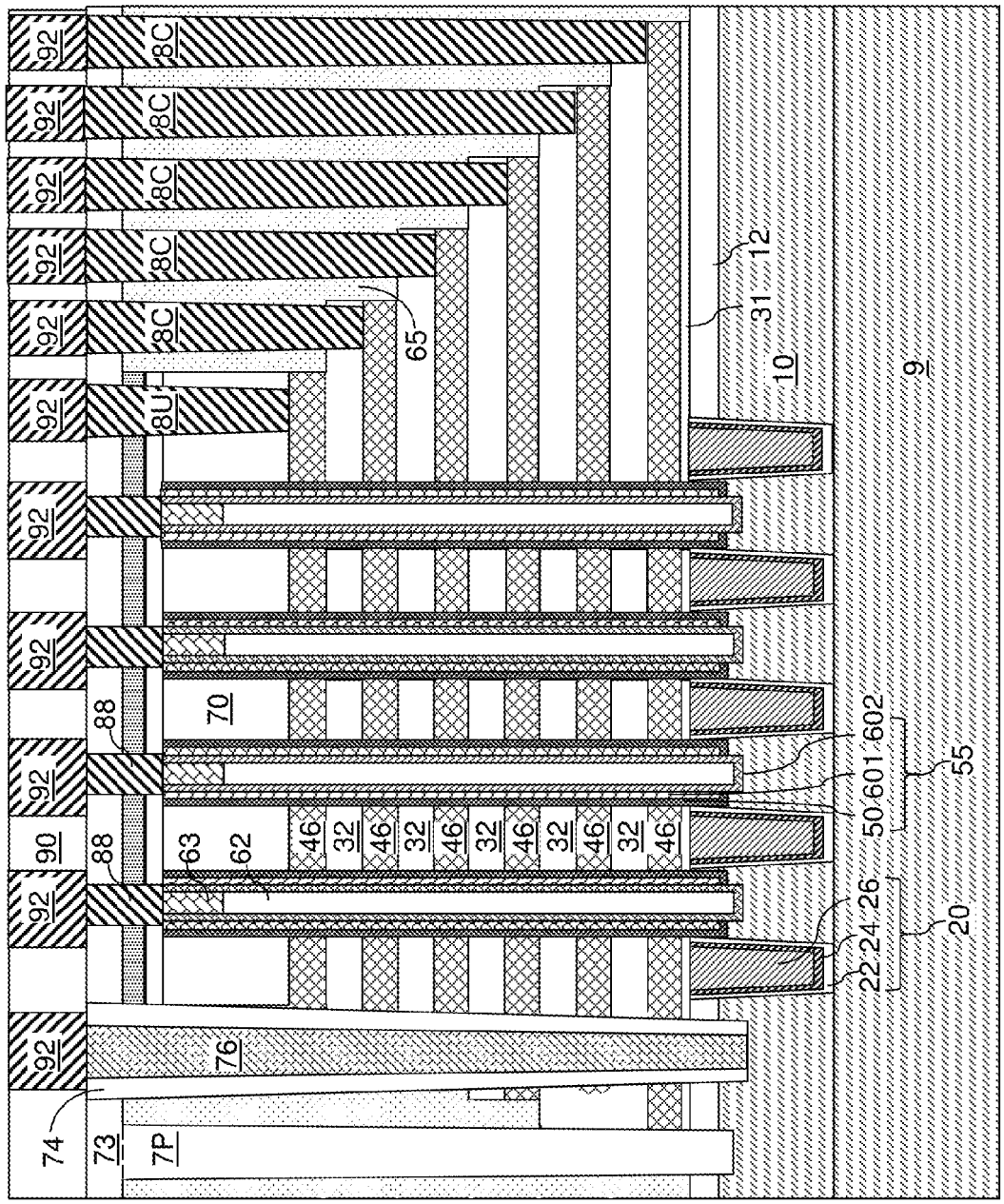

Referring to FIGS. 11A and 11B, the deposited conductive material is etched back from the sidewalls of each backside contact trench 79 and from above the dielectric pillar material layer 73 (or the topmost layer of the exemplary structure in case the dielectric pillar material layer 73 is not employed), for example, by an isotropic etch. Each remaining portion of the deposited conductive material in the backside recesses 43 constitutes an electrically conductive layer 46. Each electrically conductive layer 46 can be a conductive line structure.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

An insulating spacer 74 can be formed on the sidewalls of the backside contact trench 79 by deposition of a contiguous dielectric material layer and an anisotropic etch of its horizontal portions. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the exemplary structure (which can be, for example, the dielectric pillar material layer 73) and in the cavity laterally surrounded by the insulating spacer 74, and is lithographically patterned to form various openings in a peripheral device region. The locations and the shapes of the various openings are selected to correspond to electrical nodes of the semiconductor devices to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. In one embodiment, different types of via cavities can be formed separately employing multiple combinations of photoresist layers and anisotropic etch processes. The vertical extent of each gate via cavity, as measured from the top surface of the dielectric pillar material layer 73 to the bottom surface of the gate via cavity, can be less than the vertical distance between the top surface of the dielectric pillar material layer 73 and the topmost surface of the alternating plurality (32, 46) of the insulator layers 32 and the electrically conductive layers 46. The photoresist layer can be subsequently removed, for example, by ashing.

Another photoresist layer (not shown) can be applied over the exemplary structure, and can be lithographically patterned to form openings within a contact region in which formation of contact via structures for the electrically conductive layers 46 is desired. Via cavities can be formed through the retro-stepped dielectric material portion 65 by transfer of the pattern of the opening by an anisotropic etch. Each via cavity can vertically extend to a top surface of a respective electrically conductive layer 46.

The cavity laterally surrounded by the insulating spacer 74 and the various via cavities in the peripheral device region are filled with a conductive material to form various contact via structures. For example, a backside contact via structure 76 can be formed in the cavity surrounded by the insulating spacer 74, a gate contact via structure 8G is formed in each gate via cavity, and an active region via structure 8A is formed in each active region via cavity. Further, control gate contact via structures 8C can be formed within each contact via cavity that extends to a top surface of the electrically conductive layers 46. Similarly, drain contact via structures 88 can be formed to provide electrical contact to the drain regions 63.

Subsequently, a line-level dielectric layer 90 can be formed over the dielectric pillar material layer 73, and various conductive line structures 92 can be formed in the line-level dielectric layer 90 to provide electrical contact to the various contact via structures (76, 8G, 8A, 88, 8C). A subset of the electrically conductive layers 46 can function as control gate electrodes for the memory stack structures 55 in the device region. Optionally, at least one subset of the electrically conductive layers 46 can be employed as at least one drain select gate electrode and/or at least one source select gate electrode.

The exemplary structure is a multilevel structure including a stack (32, 46) of an alternating plurality of electrically conductive layers 46 and insulator layers 32 located over a semiconductor substrate including the semiconductor material layer 10. An array of memory stack structures 55 can be located within memory openings through the stack (32, 46).

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

In case the exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

In a non-limiting illustrative example, the insulating layers 32 can comprise silicon oxide layers, the plurality of word lines 46 can comprise tungsten or a combination of titanium nitride and tungsten, the at least one charge storage region can comprise a tunneling dielectric, a blocking dielectric layer, and either a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region 300. The plurality of word lines 46 extends from the device region 100 to the contact region 300. The backside contact via structure 76 can be a source line that extends through a dielectric insulated trench, i.e., the backside contact trench 79 filled with the dielectric spacer 74 and the backside contact via structure 76, in the stack to electrically contact the source region (not shown). The source region can be in contact with the horizontal portion of the semiconductor channel in an upper portion of the semiconductor material layer 10. A drain line, as embodied as a conductive line structure 92 that contacts a drain contact via structure 88, electrically contacts an upper portion of the semiconductor channel (601, 602). As used herein, a first element "electrically contacts" a second element if the first element is electrically shorted to the second element.

Referring back to FIGS. 2F, 3B, 4B, 5B, 6B, 9A, and 9B collectively, each memory film 50 in the monolithic three-dimensional memory device of the present disclosure can include a memory film 50 located at a periphery of a memory opening, and semiconductor channel 60 contacting an inner sidewall of the memory film 50. The memory film 50 comprises, from outside to inside, a blocking dielectric 502, at least one charge storage element 504, and a tunneling dielectric 54 contacting the semiconductor channel (601, 602). The tunneling dielectric 54 comprises a layered stack including at least, from outside to inside, a dielectric metal oxide layer (e.g., the second tunneling dielectric layer 542) having a dielectric constant greater than 7.9 and a silicon oxide layer (e.g., the third tunneling dielectric layer 543) in contact with an inner sidewall of the dielectric metal oxide layer. The dielectric metal oxide layer can comprise an oxide of at least one metal selected from Al, transition metal elements, Lanthanides, and Actinides. In one embodiment, the oxide of the at least one metal can consist essentially of the at least one metal and oxygen, or of the at least one metal, oxygen, and nitrogen.

An interface between the dielectric metal oxide layer and the silicon oxide layer extends through a stack (32 46) of alternating plurality of the insulator layers 32 and the electrically conductive layers 46. The silicon oxide layer (e.g., the third tunneling dielectric layer 543) can be in contact with a sidewall of the semiconductor channel (601, 602) as in the first, second, fourth and fifth exemplary memory stack structures 55 illustrated in FIGS. 2F, 3B, 5B and 6B. In one embodiment, the tunneling dielectric 54 can further comprise another silicon oxide layer (e.g., the first tunneling dielectric 541) in contact with an outer sidewall of the dielectric metal oxide layer (e.g., the second tunneling dielectric 542) and with an inner sidewall of the at least one charge storage element 504 as in the first exemplary memory stack structure 55 illustrated in FIG. 2F. In another embodiment, the dielectric metal oxide layer (e.g., the second tunneling dielectric 542) can be in contact with an inner sidewall of the at least one charge storage element 504 as in the second through fifth exemplary memory stack structure 55 illustrated in FIGS. 3B, 4B, 5B and 6B. In yet another embodiment, the tunneling dielectric 54 can further comprise another dielectric metal oxide layer (e.g., the fourth tunneling dielectric 544) in contact with an inner sidewall of the silicon oxide layer (e.g., the third tunneling dielectric 543) and an outer sidewall of the semiconductor channel (601, 602), as in the third exemplary memory stack structure 55 illustrated in FIG. 4B.

The at least one charge storage element 504 can be selected from a charge trapping layer and a set of at least one floating gate. A charge trapping layer within a memory opening can include at least as many charge storage elements as the number of control gates provided within the alternating stack (32, 46) because each portion of the charge trapping layer adjacent to a control gate electrode constitutes a charge storage element in which a bit data can be stored as presence or absence of electrical charges. In one embodiment, the at least one charge storage element 504 can comprise silicon nitride in contact with an outer sidewall of the tunneling dielectric 54 and with an inner sidewall of the blocking dielectric 502. The blocking dielectric 502 can comprise a stack, from outside to inside, another dielectric metal oxide layer (e.g., the first blocking dielectric 501) and another silicon oxide layer (e.g., the second blocking dielectric 503). In one embodiment, the effective oxide thickness of the blocking dielectric 502 can be greater than the effective oxide thickness of the tunneling dielectric 54.

Referring to FIG. 12, band gap diagrams are illustrated for a first exemplary tunneling dielectric (541, 542, 543) within a first exemplary memory stack structure for a no bias state, a programming state, and an erase state. A dielectric metal oxide material having a dielectric constant greater than 7.9 are commonly referred to as high-k dielectric materials, and tend to have a smaller band gap than silicon oxide and silicon nitride, and tend to have a greater band gap than semiconductor materials. Thus, the energy barrier through which electrons need to pass during programming can be less for the first exemplary tunneling dielectric (541, 542, 543) within a first exemplary memory stack structure than for an ONO stack of a comparable thickness, in which a layered stack consisting of a silicon oxide layer, a silicon nitride layer, and another silicon oxide layer is employed. For example, during programming, electrons tunnel through the first exemplary tunneling dielectric (541, 542, 543) in the following order: from the semiconductor channel (601, 602), through the third tunneling dielectric 543, the second tunneling dielectric 542, and the first tunneling dielectric 541, and into the at least one charge storage element 504. Further, the energy bather through which holes need to pass during erasing can be less for the first exemplary tunneling dielectric (541, 542, 543) within a first exemplary memory stack structure than for the ONO stack of the comparable thickness. For example, during erasing, holes tunnel through the first exemplary tunneling dielectric (541, 542, 543) in the following order: from the semiconductor channel (601, 602), through the third tunneling dielectric 543, the second tunneling dielectric 542, and the first tunneling dielectric 541, and into the at least one charge storage element 504. The presence of the first tunneling dielectric 541 including silicon oxide and contacting the at least one charge storage element 504 (as embodied as a silicon nitride layer) does not significantly increase the energy barrier for programming and tunneling because the applied electrical bias during programming and erasing shifts the portion of the energy band for the first tunneling dielectric 541 in a direction favorable to tunneling of electrons or holes. During the no bias state, the first tunneling dielectric 541 can provide significant energy barrier for leakage current through the first exemplary tunneling dielectric (541, 542, 543) in addition to the energy bather provided by the third tunneling dielectric 543. By optimizing the thicknesses of the second and third tunneling dielectrics (541, 542, 543), the tunneling dielectric (541, 542, 543) can provide a surmountable energy bather for charge carriers during the programming mode and the erasing mode, and can provide a high enough energy bather to retain electrical charges in the no bias state.

In an illustrative example, a total physical thickness for the first exemplary tunneling dielectric (541, 542, 543) can be set in a range from 3 nm to 10 nm, and the total physical thickness can be apportioned among the first, second, and third tunneling dielectrics (541, 542, 543) in a manner that simultaneously optimizes the charge tunneling characteristics during the programming and erasing states, and the charge retention characteristics during the no bias state. Alternatively, a total equivalent oxide thickness for the first exemplary tunneling dielectric (541, 542, 543) can be set in a range from 3 nm to 10 nm, and the total equivalent oxide thickness can be apportioned among the first, second, and third tunneling dielectrics (541, 542, 543) in a manner that simultaneously optimizes the charge tunneling characteristics during the programming and erasing states, and the charge retention characteristics during the no bias state.

According to the various embodiments of the present disclosure, in addition to having more opportunities to optimize tunnel barriers by band gap engineering using various high-k dielectrics with different properties such as band gap, the presence of high-k film(s) within the tunneling dielectric provides additional advantages. For instance, during a programming operation, when high positive bias is applied to a control gate electrode (e.g. 16 V-25 V) while the channel is kept at low bias (e.g. 0 V), due to much higher capacitive coupling to the channel, the inversion in the channel is stronger, the electron concentration in inversion layer is higher, leading to higher tunneling current and faster programming During a read operation, some positive bias may be applied to select gate electrodes (e.g., about 2 V to 5 V), and to control gate electrodes (word lines) of unselected cells (e.g. about 7 V to 10 V) in the NAND string. Depending on the state of the selected cell being read, some bias is applied to the selected cell control gate. Due to a higher capacitive coupling to the semiconductor channel in the presence of high-k dielectric(s) in the memory layer, the inversion is stronger, electron concentration is higher, and the cell read current is higher, leading to more efficient read operation compared to prior art devices. During an erase operation, when the channel potential is raised to high level, e.g. (16 V-25 V), while a control gate electrode (WL) bias is low (e.g. 0V), due to much higher capacitive coupling from channel to a control gate electrode, the concentration of holes at the channel-tunneling dielectric interface will be higher, leading to higher hole tunneling current and faster erase. The electrical bias voltages described above are merely illustrative, and may be higher or lower.

Referring to FIG. 13, band gap diagrams are illustrated for a second exemplary tunneling dielectric (542, 543) within a second exemplary memory stack structure for a no bias state, a programming state, and an erase state. The energy barrier through which electrons need to pass during programming can be less for the second exemplary tunneling dielectric (542, 543) within a second exemplary memory stack structure than for an ONO stack of a comparable thickness. During a programming operation, electrons tunnel from the semiconductor channel (601, 602), through the third tunneling dielectric 543 and the second tunneling dielectric 542, and into the at least one charge storage element 504. During an erase operation, holes tunnel from the semiconductor channel (601, 602), through the third tunneling dielectric 543 and the second tunneling dielectric 542, and into the at least one charge storage element 504. Further, the energy barrier through which holes need to pass during erasing can be less for the second exemplary tunneling dielectric (542, 543) within a second exemplary memory stack structure than for the ONO stack of the comparable thickness. The thickness of the second tunneling dielectric 542 (which includes a dielectric metal oxide material and contacts the at least one charge storage element 504 (as embodied as a silicon nitride layer)) within the second exemplary tunneling dielectric (542, 543) can be greater than the thickness of a second tunneling dielectric 542 within the first exemplary tunneling dielectric (541, 542, 543). The increased thickness of the second tunneling dielectric 542 in the second exemplary tunneling dielectric (542, 543) does not significantly increase the energy barrier for programming and tunneling because the applied electrical bias during programming and erasing shifts the portion of the energy band for the second tunneling dielectric 542 in a direction favorable to tunneling of electrons or holes. During the no bias state, the first tunneling dielectric 541 can provide significant energy barrier for leakage current through the second exemplary tunneling dielectric (542, 543). By optimizing the thicknesses of the first, second, and third tunneling dielectrics (542, 543), the tunneling dielectric (542, 543) can provide a surmountable energy barrier for charge carriers during the programming mode and the erasing mode, and can provide a high enough energy bather to retain electrical charges in the no bias state.

In an illustrative example, a total physical thickness for the second exemplary tunneling dielectric (542, 543) can be set in a range from 3 nm to 10 nm, and the total physical thickness can be apportioned between the second and third tunneling dielectrics (542, 543) in a manner that simultaneously optimizes the charge tunneling characteristics during the programming and erasing states, and the charge retention characteristics during the no bias state. Alternatively, a total equivalent oxide thickness for the second exemplary tunneling dielectric (542, 543) can be set in a range from 3 nm to 10 nm, and the total equivalent oxide thickness can be apportioned between the second and third tunneling dielectrics (542, 543) in a manner that simultaneously optimizes the charge tunneling characteristics during the programming and erasing states, and the charge retention characteristics during the no bias state.

Referring to FIG. 14, band gap diagrams are illustrated for a third exemplary tunneling dielectric (542, 543, 544) within a third exemplary memory stack structure for a no bias state, a programming state, and an erase state. The energy barrier through which electrons need to pass during programming can be less for the third exemplary tunneling dielectric (542, 543, 544) within a third exemplary memory stack structure than for an ONO stack of a comparable thickness. During a programming operation, electrons tunnel from the semiconductor channel (601, 602), through the fourth tunneling dielectric 544, the third tunneling dielectric 543, and the second tunneling dielectric 542, and into the at least one charge storage element 504. During an erase operation, holes tunnel from the semiconductor channel (601, 602), through the fourth tunneling dielectric 544, the third tunneling dielectric 543, and the second tunneling dielectric 542, and into the at least one charge storage element 504. Further, the energy bather through which holes need to pass during erasing can be less for the third exemplary tunneling dielectric (542, 543, 544) within a third exemplary memory stack structure than for the ONO stack of the comparable thickness. The presence of the second tunneling dielectric 542 including a high-k dielectric metal oxide and contacting the at least one charge storage element 504 (as embodied as a silicon nitride layer) does not significantly increase the energy barrier for programming and tunneling because the applied electrical bias during programming and erasing shifts the portion of the energy band for the second tunneling dielectric 542 in a direction favorable to tunneling of electrons or holes. Further, the presence of the fourth tunneling dielectric 544, as embodied in another high-k dielectric metal oxide layer in contact with the semiconductor channel 60, provides a lower energy barrier height than a silicon oxide layer in contact with a semiconductor channel, thereby reducing the overall energy barrier for programming and tunneling. During the no bias state, the third tunneling dielectric 543 can provide significant energy barrier for leakage current through the third exemplary tunneling dielectric (542, 543, 544). By optimizing the thicknesses of the second, third, and fourth tunneling dielectrics (542, 543, 544), the tunneling dielectric (542, 543, 544) can provide a surmountable energy barrier for charge carriers during the programming mode and the erasing mode, and can provide a high enough energy barrier to retain electrical charges in the no bias state.

In an illustrative example, a total physical thickness for the third exemplary tunneling dielectric (542, 543, 544) can be set in a range from 3 nm to 10 nm, and the total physical thickness can be apportioned among the second, third, and fourth tunneling dielectrics (542, 543, 544) in a manner that simultaneously optimizes the charge tunneling characteristics during the programming and erasing states, and the charge retention characteristics during the no bias state. Alternatively, a total equivalent oxide thickness for the third exemplary tunneling dielectric (542, 543, 544) can be set in a range from 3 nm to 10 nm, and the total equivalent oxide thickness can be apportioned among the second, third, and fourth tunneling dielectrics (542, 543, 544) in a manner that simultaneously optimizes the charge tunneling characteristics during the programming and erasing states, and the charge retention characteristics during the no bias state.

Figure 15:
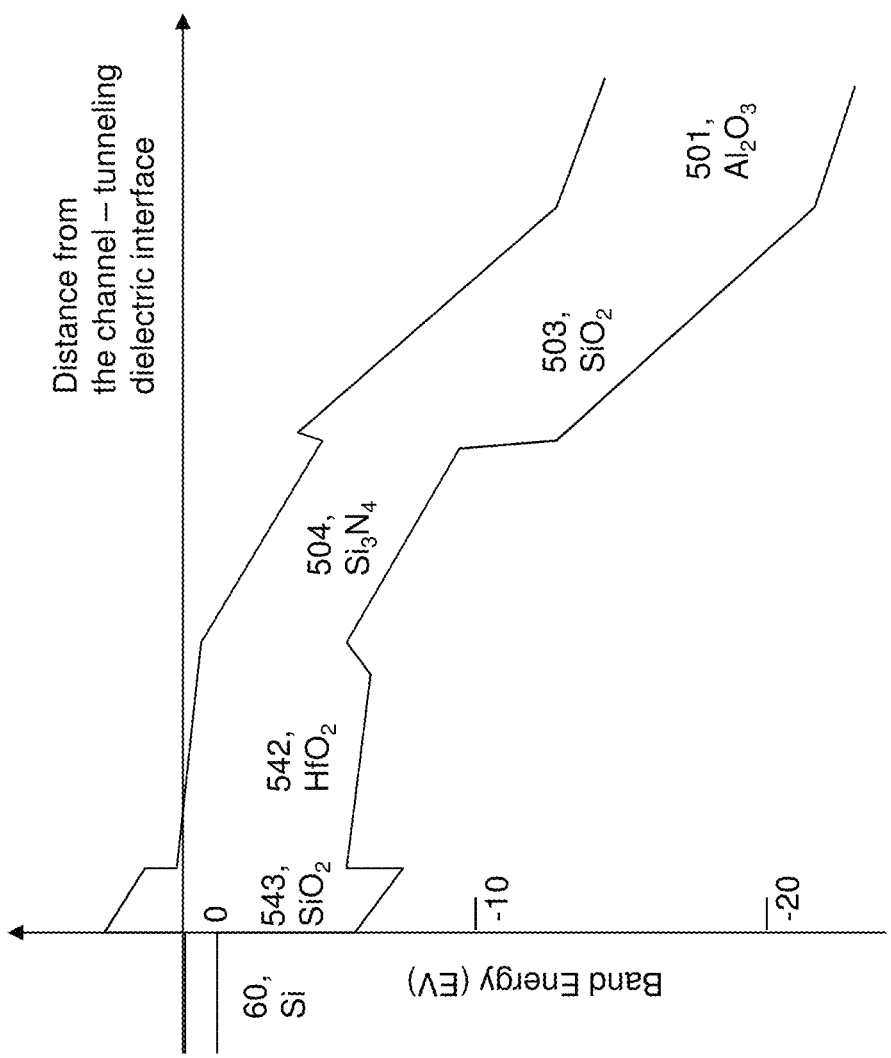
FIG. 15 illustrates a band gap diagram for an exemplary memory film according to an embodiment of the present disclosure.

Referring to FIG. 15, the band gap diagram for an exemplary memory film 50 is illustrated for a programming state, in which an external bias of 20 volts is applied across the semiconductor channel 60 and a control gate electrode (not shown) that contacts a first blocking dielectric 501. For example, a positive 20 V bias can be applied to the control gates while the semiconductor channel is at zero bias. The thicknesses of the second tunneling dielectric 542 and the third tunneling dielectric 543 are optimized under the constraint of fixed thicknesses and fixed material choices for the blocking dielectric (501, 502) and the at least one charge storage element 504 (which is a silicon nitride layer in this case), and under the constraint of selection of hafnium oxide for the material of the second tunneling dielectric 542.

Figure 16:
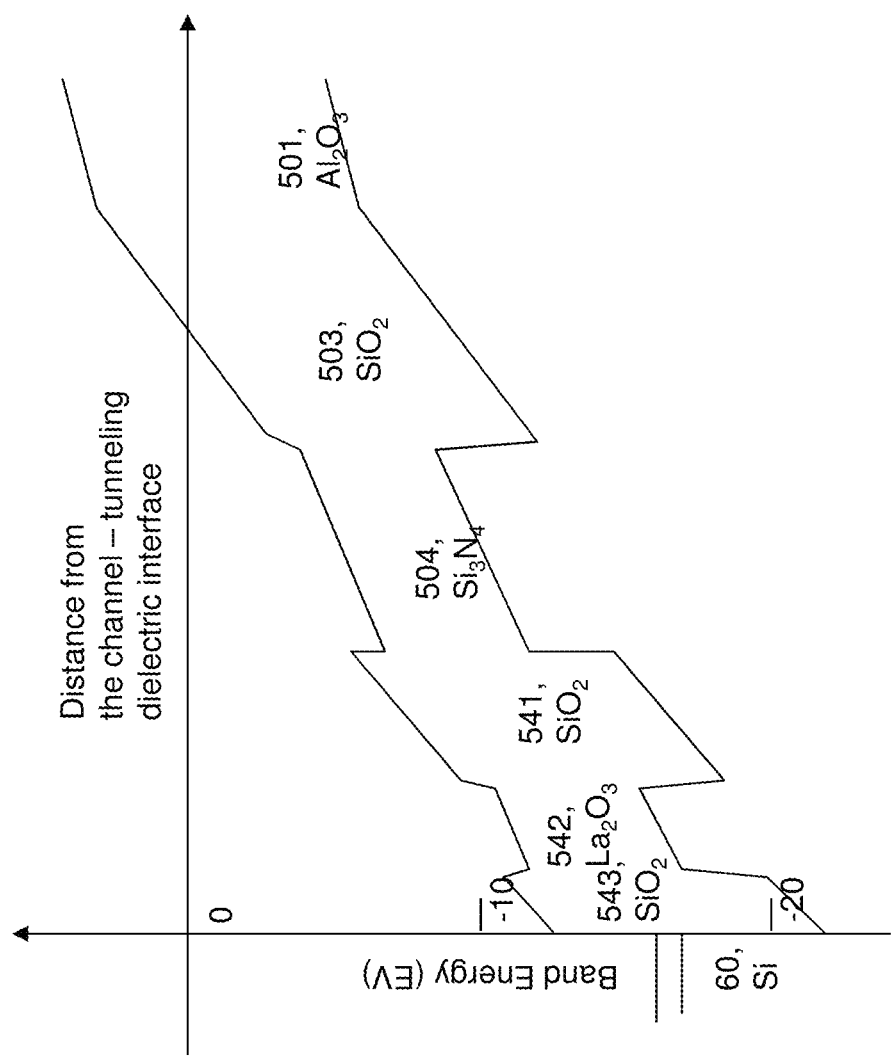
FIG. 16 illustrates a band gap diagram for another exemplary memory film according to an embodiment of the present disclosure.

Referring to FIG. 16, the band gap diagram for another exemplary memory film 50 is illustrated for an erasing state, in which an external bias of −20 volts is applied across the semiconductor channel 60 and a control gate electrode (not shown) that contacts a first blocking dielectric 501. For example, a positive 20 V bias can be applied to the channel while the control gate is at zero bias. The thicknesses of the first tunneling dielectric 541, the second tunneling dielectric 542, and the third tunneling dielectric 543 are optimized under the constraint of fixed thicknesses and fixed material choices for the blocking dielectric (501, 502) and the at least one charge storage element 504 (which is a silicon nitride layer in this case), and under the constraint of selection of lanthanum oxide for the material of the second tunneling dielectric 542.

In one embodiment, the voltage margin between the programmed state and the unprogrammed state for any set selected cell read current value less than 1 microampere can be increased by employing the exemplary memory film 50 according to various embodiments of the present disclosure in lieu of conventional memory film including an ONO stack as a tunneling dielectric. Specifically, the program efficiency is improved employing the exemplary memory film 50 according to various embodiments of the present disclosure in lieu of conventional memory film including an ONO stack as a tunneling dielectric for all three memory opening 49 diameters. Further, the improvements in the voltage margin between the programmed state and the unprogrammed state can be achieved using the memory film 50 of the first or third through fifth embodiments. It is understood that the degree of improvement in the voltage margin between the programmed state and the unprogrammed state for a preset selected cell read current value can vary among the various embodiments of the present disclosure. Further, it is understood that the degree of improvement in efficiency of programming, improvement in efficiency of erasing, improvement in efficiency of a read operation, charge retention, and other metrics for performance of a tunneling dielectric over prior art tunneling dielectrics employing an ONO stack may vary among the various embodiments of the present disclosure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device, comprising:
  a stack including an alternating plurality of electrically insulating layers and electrically conductive layers located over a substrate;
  a memory opening extending through the stack;
  a memory film located at a periphery of the memory opening; and a semiconductor channel contacting an inner sidewall of the memory film, wherein:

the memory film comprises, from outside to inside, at least one charge storage element, and a tunneling dielectric contacting the semiconductor channel;

the tunneling dielectric comprises a layered stack including at least, from outside to inside, a dielectric metal oxide layer having a dielectric constant greater than 7.9 and a silicon oxide layer; and the tunneling dielectric further comprises an element selected from:

a silicon nitride layer in contact with an inner sidewall of the dielectric metal oxide layer and an outer sidewall of the silicon oxide layer; or an additional dielectric metal oxide layer in contact with an inner sidewall of the dielectric metal oxide layer and an outer sidewall of the silicon oxide layer.

2. The monolithic three-dimensional memory device of claim 1, wherein the dielectric metal oxide layer comprises an oxide of at least one metal selected from Al, transition metal elements, Lanthanides, and Actinides.

3. The monolithic three-dimensional memory device of claim 2, wherein the oxide of the at least one metal consists essentially of the at least one metal and oxygen, or of the at least one metal, oxygen, and nitrogen.

4. The monolithic three-dimensional memory device of claim 1, wherein an interface between the dielectric metal oxide layer and the silicon oxide layer extends through the stack.

5. The monolithic three-dimensional memory device of claim 1, wherein the silicon oxide layer is in contact with an inner sidewall of the dielectric metal oxide layer.

6. The monolithic three-dimensional memory device of claim 5, wherein the dielectric metal oxide layer is in contact with an inner sidewall of the at least one charge storage element.

7. The monolithic three-dimensional memory device of claim 6, wherein the tunneling dielectric further comprises another dielectric metal oxide layer in contact with an inner sidewall of the silicon oxide layer and an outer sidewall of the semiconductor channel.

8. The monolithic three-dimensional memory device of claim 6, wherein the silicon oxide layer is in contact with a sidewall of the semiconductor channel.

9. The monolithic three-dimensional memory device of claim 5, wherein the tunneling dielectric further comprises another silicon oxide layer in contact with an outer sidewall of the dielectric metal oxide layer and with an inner sidewall of the at least one charge storage element.

10. The monolithic three-dimensional memory device of claim 1, wherein the tunneling dielectric further comprises the silicon nitride layer in contact with the inner sidewall of the dielectric metal oxide layer and the outer sidewall of the silicon oxide layer.

11. The monolithic three-dimensional memory device of claim 1, wherein the tunneling dielectric further comprises the additional dielectric metal oxide layer in contact with the inner sidewall of the dielectric metal oxide layer and the outer sidewall of the silicon oxide layer.

12. The monolithic three-dimensional memory device of claim 1, wherein the at least one charge storage element is selected from a charge trapping layer and a set of at least one floating gate.

13. The monolithic three-dimensional memory device of claim 1, wherein the at least one charge storage element comprises silicon nitride in contact with an outer sidewall of the tunneling dielectric and with an inner sidewall of a blocking dielectric.

14. The monolithic three-dimensional memory device of claim 1, further comprising a blocking dielectric in contact with the at least one charge storage element, wherein the blocking dielectric comprises a stack, from outside to inside, another dielectric metal oxide layer and another silicon oxide layer, wherein an effective oxide thickness of the blocking dielectric is greater than an effective oxide thickness of the tunneling dielectric.

15. The monolithic three-dimensional memory device of claim 1, wherein the silicon oxide layer has a thickness in a range from 0.5 nm to 5 nm, and the dielectric metal oxide layer has a thickness in a range from 0.5 nm to 5 nm.

16. The monolithic three-dimensional memory device of claim 1, wherein:

the device comprises a vertical NAND device located in a device region; and at least one of the electrically conductive layers in the stack comprises, or is electrically connected to, a word line of the NAND device;

the device region comprises:

a plurality of semiconductor channels, wherein at least one end portion of each of the plurality of semiconductor channels extends substantially perpendicular to a top surface of the substrate;

a plurality of charge storage regions, each charge storage region located adjacent to a respective one of the plurality of semiconductor channels; and a plurality of control gate electrodes having a strip shape extending substantially parallel to the top surface of the substrate;

the plurality of control gate electrodes comprise at least a first control gate electrode located in a first device level and a second control gate electrode located in a second device level;

the electrically conductive layers in the stack comprise, or are in electrical contact with, the plurality of control gate electrodes and extend from the device region to a contact region including the plurality of electrically conductive via connections; and the substrate comprises a silicon substrate containing a driver circuit for the NAND device.

17. A method of manufacturing a monolithic three-dimensional memory device, comprising:

forming a stack of alternating plurality of first material layers and second material layers over a substrate;

forming a memory opening through the stack;

forming at a periphery of the memory opening from outside to inside, at least one charge storage element and a tunneling dielectric, the tunneling dielectric including a dielectric metal oxide layer having a dielectric constant greater than 7.9 and a silicon oxide layer;

forming an element selected from a silicon nitride layer and an additional dielectric metal oxide layer on an inner sidewall of the dielectric metal oxide layer, wherein the silicon oxide layer is formed on the selected element; and forming a semiconductor channel over an inner sidewall of the tunneling dielectric.

18. The method of claim 17, wherein forming the dielectric metal oxide layer comprises depositing an oxide of at least one metal selected from Al, transition metal elements, Lanthanides, and Actinides.

19. The method of claim 18, wherein the oxide of the at least one metal consists essentially of the at least one metal and oxygen, or of the at least one metal, oxygen, and nitrogen.

20. The method of claim 17, wherein the silicon oxide layer is formed directly on an inner sidewall of the dielectric metal oxide layer.

21. The method of claim 20, wherein the dielectric metal oxide layer is formed directly on an inner sidewall of the at least one charge storage element.

22. The method of claim 21, further comprising forming an additional dielectric metal oxide layer directly on an inner sidewall of the silicon oxide layer, wherein the semiconductor channel is formed directly on the additional dielectric metal oxide layer.

23. The method of claim 21, wherein the semiconductor channel is formed directly on a sidewall of the silicon oxide layer.

24. The method of claim 20, further comprising forming another silicon oxide layer on the at least one charge storage element prior to forming the dielectric metal oxide layer.

25. The method of claim 17, wherein forming the element comprises forming the silicon nitride layer on the inner sidewall of the dielectric metal oxide layer, wherein the silicon oxide layer is formed on the silicon nitride layer.

26. The method of claim 17, wherein forming the element comprises forming the additional dielectric metal oxide layer on the inner sidewall of the dielectric metal oxide layer, wherein the silicon oxide layer is formed on the additional dielectric metal oxide layer.

27. The method of claim 17, wherein the at least one charge storage element is selected from a charge trapping layer and a set of at least one floating gate.

28. The method of claim 17, further comprising forming at least one blocking dielectric layer within the memory opening, wherein:
the at least one charge storage element is a silicon nitride layer formed directly on the at least one blocking dielectric layer; and
the tunneling dielectric is formed directly on the at least one charge storage element.

29. The method of claim 28, wherein the at least one blocking dielectric layer comprises a stack, from outside to inside, another dielectric metal oxide layer and another silicon oxide layer, wherein an effective oxide thickness of the at least one blocking dielectric layer is greater than an effective oxide thickness of the tunneling dielectric.

30. A method of manufacturing a monolithic three-dimensional memory device, comprising:
forming a stack of alternating plurality of first material layers and second material layers over a substrate;
forming a memory opening through the stack;
forming at a periphery of the memory opening from outside to inside, at least one charge storage element and a tunneling dielectric, the tunneling dielectric including a dielectric metal oxide layer having a dielectric constant greater than 7.9 and a silicon oxide layer; and
forming a semiconductor channel over an inner sidewall of the tunneling dielectric, wherein the second material layers are sacrificial material layers, and the method further comprises replacing the second material layers with electrically conductive layers, wherein the electrically conductive layers comprise control gate electrodes for the monolithic three-dimensional memory device.

31. The method of claim 30, further comprising forming a backside blocking dielectric layer over an outer sidewall of the at least one charge storage element after removal of the second material layers and prior to deposition of the electrically conductive materials.

32. The method of claim 30, wherein:
the device comprises a vertical NAND device located in a device region;
at least one of the electrically conductive layers in the stack comprises, or is electrically connected to, a word line of the NAND device;
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level; and
the electrically conductive layers in the stack comprise, or are in electrical contact with, the plurality of control gate electrodes and extend from the device region to a contact region including the plurality of electrically conductive via connections; and
the substrate comprises a silicon substrate containing a driver circuit for the NAND device.

33. A monolithic three-dimensional memory device, comprising:
a stack including an alternating plurality of electrically insulating layers and electrically conductive layers located over a substrate;
a memory opening extending through the stack;
a memory film located at a periphery of the memory opening; and
a semiconductor channel contacting an inner sidewall of the memory film, wherein:
the memory film comprises, from outside to inside, at least one charge storage element, and a tunneling dielectric contacting the semiconductor channel;
the tunneling dielectric comprises a layered stack including at least, from outside to inside, a dielectric metal oxide layer having a dielectric constant greater than 7.9 and a silicon oxide layer;
the monolithic three-dimensional memory device further comprises a blocking dielectric in contact with the at least one charge storage element;
the blocking dielectric comprises a stack, from outside to inside, another dielectric metal oxide layer and another silicon oxide layer; and
an effective oxide thickness of the blocking dielectric is greater than an effective oxide thickness of the tunneling dielectric.

34. The monolithic three-dimensional memory device of claim 33, wherein the tunneling dielectric further comprises an element selected from:
a silicon nitride layer in contact with an inner sidewall of the dielectric metal oxide layer and an outer sidewall of the silicon oxide layer; and an additional dielectric metal oxide layer in contact with an inner sidewall of the dielectric metal oxide layer and an outer sidewall of the silicon oxide layer.

35. A monolithic three-dimensional memory device, comprising:
a stack including an alternating plurality of electrically insulating layers and electrically conductive layers located over a substrate;
a memory opening extending through the stack;
a memory film located at a periphery of the memory opening; and
a semiconductor channel contacting an inner sidewall of the memory film, wherein:
the memory film comprises, from outside to inside, at least one charge storage element, and a tunneling dielectric contacting the semiconductor channel;
the tunneling dielectric comprises a layered stack including at least, from outside to inside, a dielectric metal oxide layer having a dielectric constant greater than 7.9 and a silicon oxide layer;
the device comprises a vertical NAND device located in a device region;
at least one of the electrically conductive layers in the stack comprises, or is electrically connected to, a word line of the NAND device;
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level;
the electrically conductive layers in the stack comprise, or are in electrical contact with, the plurality of control gate electrodes and extend from the device region to a contact region including the plurality of electrically conductive via connections; and
the substrate comprises a silicon substrate containing a driver circuit for the NAND device.

36. A method of manufacturing a monolithic three-dimensional memory device, comprising:
forming a stack of alternating plurality of first material layers and second material layers over a substrate;
forming a memory opening through the stack;
forming at a periphery of the memory opening from outside to inside, at least one charge storage element and a tunneling dielectric, the tunneling dielectric including a dielectric metal oxide layer having a dielectric constant greater than 7.9 and a silicon oxide layer; and
forming a semiconductor channel over an inner sidewall of the tunneling dielectric, wherein:
the silicon oxide layer is formed directly on an inner sidewall of the dielectric metal oxide layer;
the dielectric metal oxide layer is formed directly on an inner sidewall of the at least one charge storage element;
the method further comprises forming an additional dielectric metal oxide layer directly on an inner sidewall of the silicon oxide layer; and
the semiconductor channel is formed directly on the additional dielectric metal oxide layer.

37. A method of manufacturing a monolithic three-dimensional memory device, comprising:
forming a stack of alternating plurality of first material layers and second material layers over a substrate;
forming a memory opening through the stack;
forming at least one blocking dielectric layer within the memory opening;
forming at a periphery of the memory opening from outside to inside, at least one charge storage element and a tunneling dielectric, the tunneling dielectric including a dielectric metal oxide layer having a dielectric constant greater than 7.9 and a silicon oxide layer; and
forming a semiconductor channel over an inner sidewall of the tunneling dielectric, wherein:
the at least one charge storage element is a silicon nitride layer formed directly on the at least one blocking dielectric layer;
the tunneling dielectric is formed directly on the at least one charge storage element;
the at least one blocking dielectric layer comprises a stack, from outside to inside, another dielectric metal oxide layer and another silicon oxide layer; and
an effective oxide thickness of the at least one blocking dielectric layer is greater than an effective oxide thickness of the tunneling dielectric.

38. The method of claim 37, further comprising forming an element selected from a silicon nitride layer and an additional dielectric metal oxide layer on an inner sidewall of the dielectric metal oxide layer, wherein the silicon oxide layer is formed on the selected element.

* * * * *